(12) United States Patent  (10) Patent No.: US 8,072,082 B2
Yean et al.  (45) Date of Patent: Dec. 6, 2011

(54) PRE-ENCAPSULATED CAVITY INTERPOSER

(75) Inventors: Tay Wuu Yean, Singapore (SG); Wang Ai-Chie, Singapore (SG)

(73) Assignee: Micron Technology, Inc., Boise, ID (US)

( * ) Notice: Subject to any disclaimer, the term of this patent is extended or adjusted under 35 U.S.C. 154(b) by 373 days.

(21) Appl. No.: 12/128,575

(22) Filed: May 28, 2008

(65) Prior Publication Data

US 2009/0267171 A1   Oct. 29, 2009

(30) Foreign Application Priority Data

Apr. 24, 2008  (SG) ................ 200803157-7

(51) Int. Cl.
H01L 23/52 (2006.01)
H01L 23/48 (2006.01)
H01L 29/40 (2006.01)

(52) U.S. Cl. ............... 257/777; 257/E21.614; 257/686; 257/723; 438/108; 438/109; 361/760

(58) Field of Classification Search ............ 438/64, 438/117, 125, 108, 109; 257/E23.019, E23.066, 257/E23.128, E23.031, E31.11, 666, 690, 257/685, 686, 698, 432, 434, 723, 724, 778, 257/777, E25.018, E25.013, E21.614; 361/760
See application file for complete search history.

(56) References Cited

U.S. PATENT DOCUMENTS

| | | |
|---|---|---|
| 3,370,203 A | 2/1968 | Kravitz et al. |
| 3,904,934 A | 9/1975 | Martin |
| 4,143,456 A | 3/1979 | Inoue |
| 4,264,917 A | 4/1981 | Ugon |
| 4,300,153 A | 11/1981 | Hayakawa et al. |
| 4,323,914 A | 4/1982 | Berndlmaier et al. |
| 4,358,552 A | 11/1982 | Shinohara et al. |
| 4,507,675 A | 3/1985 | Fujii et al. |
| 4,642,671 A | 2/1987 | Rohsler et al. |
| 4,801,998 A | 1/1989 | Okuaki |
| 4,835,120 A | 5/1989 | Mallik et al. |
| 4,862,245 A | 8/1989 | Pashby et al. |
| 4,931,852 A | 6/1990 | Brown et al. |
| 4,961,107 A | 10/1990 | Geist et al. |
| 4,984,059 A | 1/1991 | Kubota et al. |
| 4,994,411 A | 2/1991 | Naito et al. |
| 5,019,673 A | 5/1991 | Juskey et al. |
| 5,051,275 A | 9/1991 | Wong |
| 5,086,018 A | 2/1992 | Conru et al. |
| 5,101,465 A | 3/1992 | Murphy |
| 5,108,955 A | 4/1992 | Ishida et al. |

(Continued)

FOREIGN PATENT DOCUMENTS

JP  5277684  6/1977

(Continued)

OTHER PUBLICATIONS

Lin et al., Bumpless Flip Chip Packages for Cost/Performance Driven Devices, Electronic Components and Technology, Conference 2003, Publication Date, May 27-30, 2003, pp. 554-559.

(Continued)

*Primary Examiner* — Chris Chu
(74) *Attorney, Agent, or Firm* — TraskBritt

(57) ABSTRACT

A pre-encapsulated cavity interposer, a pre-encapsulated frame, for a semiconductor device.

32 Claims, 16 Drawing Sheets

U.S. PATENT DOCUMENTS

| | | | |
|---|---|---|---|
| 5,111,278 A | 5/1992 | Eichelberger | |
| 5,128,831 A | 7/1992 | Fox, III et al. | |
| 5,144,747 A | 9/1992 | Eichelberger | |
| 5,172,303 A * | 12/1992 | Bernardoni et al. | 361/744 |
| 5,173,764 A | 12/1992 | Higgins, III | |
| 5,184,208 A | 2/1993 | Sakuta et al. | |
| 5,194,930 A | 3/1993 | Papathomas et al. | |
| 5,218,759 A | 6/1993 | Juskey et al. | |
| 5,220,489 A | 6/1993 | Barreto et al. | |
| 5,241,133 A | 8/1993 | Mullen, III et al. | |
| 5,241,456 A | 8/1993 | Marcinkiewicz et al. | |
| 5,252,853 A | 10/1993 | Michii | |
| 5,266,834 A | 11/1993 | Nishi et al. | |
| 5,278,726 A | 1/1994 | Bernardoni et al. | |
| 5,280,192 A | 1/1994 | Kryzaniwsky | |
| 5,285,352 A | 2/1994 | Pastore et al. | |
| 5,286,679 A | 2/1994 | Farnworth et al. | |
| 5,293,068 A | 3/1994 | Kohno et al. | |
| 5,295,044 A | 3/1994 | Araki et al. | |
| 5,299,092 A | 3/1994 | Yaguchi et al. | |
| 5,304,842 A | 4/1994 | Farnworth et al. | |
| 5,311,060 A | 5/1994 | Rostoker et al. | |
| 5,313,096 A | 5/1994 | Eide | |
| 5,313,366 A | 5/1994 | Gaudenzi et al. | |
| 5,327,325 A * | 7/1994 | Nicewarner, Jr. | 361/760 |
| 5,334,857 A | 8/1994 | Mennitt et al. | |
| 5,344,795 A | 9/1994 | Hashemi et al. | |
| 5,373,189 A | 12/1994 | Massit et al. | |
| 5,376,825 A | 12/1994 | Tukamoto et al. | |
| 5,379,186 A | 1/1995 | Gold et al. | |
| 5,383,269 A | 1/1995 | Rathmell et al. | |
| 5,384,689 A | 1/1995 | Shen | |
| 5,394,303 A | 2/1995 | Yamaji | |
| 5,434,105 A | 7/1995 | Liou | |
| 5,436,203 A | 7/1995 | Lin | |
| 5,440,169 A | 8/1995 | Tomita et al. | |
| 5,441,684 A | 8/1995 | Lee | |
| 5,450,283 A | 9/1995 | Lin et al. | |
| 5,461,255 A | 10/1995 | Chan et al. | |
| 5,483,024 A | 1/1996 | Russell et al. | |
| 5,484,959 A | 1/1996 | Burns | |
| 5,488,254 A | 1/1996 | Nishimura et al. | |
| 5,489,538 A | 2/1996 | Rostoker et al. | |
| 5,489,801 A | 2/1996 | Blish, II | |
| 5,552,635 A | 9/1996 | Kim et al. | |
| 5,598,033 A | 1/1997 | Behlen et al. | |
| 5,598,034 A | 1/1997 | Wakefield | |
| 5,604,376 A | 2/1997 | Hamburgen et al. | |
| 5,608,265 A | 3/1997 | Kitano et al. | |
| 5,616,958 A | 4/1997 | Laine et al. | |
| 5,625,221 A | 4/1997 | Kim et al. | |
| 5,633,530 A | 5/1997 | Hsu | |
| 5,641,997 A | 6/1997 | Ohta et al. | |
| 5,652,461 A | 7/1997 | Ootssuki et al. | |
| 5,656,857 A | 8/1997 | Kishita | |
| 5,659,952 A | 8/1997 | Kovac et al. | |
| 5,661,086 A | 8/1997 | Nakashima et al. | |
| 5,668,405 A | 9/1997 | Yamashita | |
| 5,677,566 A | 10/1997 | King et al. | |
| 5,701,233 A | 12/1997 | Carson et al. | |
| 5,754,408 A | 5/1998 | Derouiche | |
| 5,770,889 A | 6/1998 | Rostoker et al. | |
| 5,781,415 A | 7/1998 | Itoh | |
| 5,798,564 A | 8/1998 | Eng et al. | |
| 5,814,885 A | 9/1998 | Pogge et al. | |
| 5,835,988 A | 11/1998 | Ishii | |
| 5,838,061 A * | 11/1998 | Kim | 257/686 |
| 5,844,315 A | 12/1998 | Melton et al. | |
| 5,866,953 A | 2/1999 | Akram et al. | |
| 5,883,426 A | 3/1999 | Tokuno et al. | |
| 5,952,611 A | 9/1999 | Eng et al. | |
| 5,952,714 A * | 9/1999 | Sano et al. | 257/680 |
| 5,973,403 A | 10/1999 | Wark | |
| 5,973,924 A | 10/1999 | Gillespie, Jr. | |
| 5,991,161 A | 11/1999 | Samaras et al. | |
| 6,013,946 A | 1/2000 | Lee et al. | |
| 6,013,948 A | 1/2000 | Akram et al. | |
| 6,031,284 A * | 2/2000 | Song | 257/701 |
| 6,093,029 A | 7/2000 | Kwon et al. | |
| 6,127,726 A | 10/2000 | Bright et al. | |
| 6,137,163 A | 10/2000 | Kim et al. | |
| 6,162,693 A | 12/2000 | Wang et al. | |
| 6,172,423 B1 | 1/2001 | Lee | |
| 6,172,874 B1 | 1/2001 | Bartilson | |
| 6,188,127 B1 * | 2/2001 | Senba et al. | 257/686 |
| 6,190,929 B1 | 2/2001 | Wang et al. | |
| 6,198,634 B1 | 3/2001 | Armezzani et al. | |
| 6,235,554 B1 | 5/2001 | Akram et al. | |
| 6,277,674 B1 | 8/2001 | Wang et al. | |
| 6,297,548 B1 * | 10/2001 | Moden et al. | 257/686 |
| 6,313,522 B1 | 11/2001 | Akram et al. | |
| 6,335,571 B1 | 1/2002 | Capote et al. | |
| 6,417,546 B2 | 7/2002 | Trivedi et al. | |
| 6,420,788 B1 | 7/2002 | Tay et al. | |
| 6,448,664 B1 | 9/2002 | Tay et al. | |
| 6,456,517 B2 * | 9/2002 | Kim et al. | 365/51 |
| 6,476,476 B1 | 11/2002 | Glenn | |
| 6,492,726 B1 * | 12/2002 | Quek et al. | 257/723 |
| 6,498,101 B1 | 12/2002 | Wang | |
| 6,501,165 B1 | 12/2002 | Farnworth et al. | |
| 6,503,805 B2 | 1/2003 | Wang et al. | |
| 6,511,868 B2 | 1/2003 | Wang et al. | |
| 6,522,018 B1 | 2/2003 | Tay et al. | |
| 6,522,019 B2 | 2/2003 | Tay et al. | |
| 6,522,375 B1 | 2/2003 | Jang et al. | |
| 6,541,395 B1 | 4/2003 | Trivedi et al. | |
| 6,548,330 B1 * | 4/2003 | Murayama et al. | 438/127 |
| 6,548,383 B1 | 4/2003 | Trivedi et al. | |
| 6,555,455 B1 | 4/2003 | Wang et al. | |
| 6,559,053 B1 | 5/2003 | Wang et al. | |
| 6,566,745 B1 | 5/2003 | Beyne et al. | |
| 6,573,592 B2 * | 6/2003 | Bolken | 257/687 |
| 6,583,518 B2 | 6/2003 | Trivedi et al. | |
| 6,586,826 B1 | 7/2003 | Glenn et al. | |
| 6,599,789 B1 | 7/2003 | Abbott et al. | |
| 6,600,335 B2 | 7/2003 | Tay et al. | |
| 6,613,617 B2 | 9/2003 | Trivedi et al. | |
| 6,614,104 B2 * | 9/2003 | Farnworth et al. | 257/686 |
| 6,634,100 B2 | 10/2003 | Akram et al. | |
| 6,650,007 B2 * | 11/2003 | Moden et al. | 257/686 |
| 6,666,751 B1 | 12/2003 | Wang | |
| 6,667,544 B1 | 12/2003 | Glenn | |
| 6,673,715 B2 | 1/2004 | Trivedi et al. | |
| 6,674,175 B2 | 1/2004 | Tay et al. | |
| 6,693,363 B2 | 2/2004 | Tay et al. | |
| 6,700,783 B1 | 3/2004 | Liu et al. | |
| 6,703,263 B2 | 3/2004 | Wang et al. | |
| 6,716,687 B2 | 4/2004 | Wang et al. | |
| 6,717,812 B1 * | 4/2004 | Pinjala et al. | 361/699 |
| 6,723,597 B2 | 4/2004 | Abbott et al. | |
| 6,730,553 B2 | 5/2004 | Cho et al. | |
| 6,734,905 B2 | 5/2004 | Fossum et al. | |
| 6,740,983 B2 | 5/2004 | Tay et al. | |
| 6,740,984 B2 | 5/2004 | Tay et al. | |
| 6,744,102 B2 | 6/2004 | Trivedi et al. | |
| 6,753,599 B2 | 6/2004 | Kim | |
| 6,753,616 B2 | 6/2004 | Coyle | |
| 6,767,778 B2 | 7/2004 | Wang et al. | |
| 6,770,921 B2 | 8/2004 | Trivedi et al. | |
| 6,773,960 B2 | 8/2004 | Fee et al. | |
| 6,774,022 B2 | 8/2004 | Wang et al. | |
| 6,777,794 B2 | 8/2004 | Nakajima | |
| 6,784,062 B2 | 8/2004 | Cho et al. | |
| 6,784,525 B2 | 8/2004 | Kuan et al. | |
| 6,787,923 B2 | 9/2004 | Tan et al. | |
| 6,792,142 B1 | 9/2004 | Wang | |
| 6,803,958 B1 | 10/2004 | Wang | |
| 6,808,994 B1 | 10/2004 | Wang | |
| 6,812,103 B2 | 11/2004 | Wang | |
| 6,812,529 B2 | 11/2004 | Trivedi et al. | |
| 6,833,627 B2 | 12/2004 | Farnworth | |
| 6,835,599 B2 | 12/2004 | Kuan et al. | |
| 6,847,220 B2 | 1/2005 | Tay et al. | |
| 6,856,010 B2 | 2/2005 | Roeters et al. | |
| 6,858,926 B2 | 2/2005 | Moden et al. | |
| 6,864,155 B2 | 3/2005 | Wang | |
| 6,867,131 B2 | 3/2005 | Wang et al. | |

| | | |
|---|---|---|
| 6,870,247 B2 | 3/2005 | Fee et al. |
| 6,872,660 B2 | 3/2005 | Trivedi et al. |
| 6,900,494 B2 | 5/2005 | Abbott et al. |
| 6,903,420 B2 | 6/2005 | Wang |
| 6,906,407 B2 * | 6/2005 | Byers et al. .................. 257/686 |
| 6,906,415 B2 | 6/2005 | Jiang et al. |
| 6,913,476 B2 | 7/2005 | Yean et al. |
| 6,927,473 B2 | 8/2005 | Wang et al. |
| 6,930,029 B2 | 8/2005 | Wang et al. |
| 6,946,325 B2 | 9/2005 | Yean et al. |
| 6,949,479 B2 | 9/2005 | Wang |
| 6,951,777 B2 | 10/2005 | Fee et al. |
| 6,962,841 B2 | 11/2005 | Trivedi et al. |
| 6,972,214 B2 | 12/2005 | Kuan et al. |
| 6,972,794 B1 | 12/2005 | Wang et al. |
| 6,974,757 B2 | 12/2005 | Wang |
| 6,977,419 B2 | 12/2005 | Wang et al. |
| 6,984,570 B2 | 1/2006 | Wang |
| 6,987,291 B2 | 1/2006 | Abbott et al. |
| 7,009,188 B2 | 3/2006 | Wang |
| 7,012,293 B2 | 3/2006 | Wang |
| 7,013,044 B2 | 3/2006 | Wang |
| 7,018,871 B2 | 3/2006 | Tan et al. |
| 7,026,548 B2 | 4/2006 | Bolken et al. |
| 7,030,640 B2 | 4/2006 | Yee et al. |
| 7,061,124 B2 | 6/2006 | Tan et al. |
| 7,071,012 B2 | 7/2006 | Tan et al. |
| 7,095,083 B2 | 8/2006 | Cho et al. |
| 7,097,036 B2 | 8/2006 | Morita |
| 7,109,105 B2 | 9/2006 | Wang et al. |
| 7,112,471 B2 * | 9/2006 | Boon et al. .................. 438/116 |
| 7,112,482 B2 | 9/2006 | Abbott et al. |
| 7,112,876 B2 | 9/2006 | Fee et al. |
| 7,116,122 B2 | 10/2006 | Tay et al. |
| 7,145,228 B2 | 12/2006 | Yean et al. |
| 7,151,303 B2 | 12/2006 | Wang et al. |
| 7,153,731 B2 | 12/2006 | Abbott et al. |
| 7,154,146 B2 | 12/2006 | Wang et al. |
| 7,169,645 B2 * | 1/2007 | Bolken et al. .............. 438/116 |
| 7,169,662 B2 | 1/2007 | Cho et al. |
| 7,186,168 B2 | 3/2007 | Wang |
| 7,189,606 B2 | 3/2007 | Wang et al. |
| 7,190,074 B2 | 3/2007 | Tan et al. |
| 7,198,980 B2 | 4/2007 | Jiang et al. |
| 7,205,656 B2 | 4/2007 | Kim et al. |
| 7,206,447 B2 | 4/2007 | Wang |
| 7,217,994 B2 * | 5/2007 | Zhu et al. .................. 257/686 |
| 7,223,626 B2 | 5/2007 | Farnworth et al. |
| 7,224,020 B2 | 5/2007 | Wang et al. |
| 7,230,343 B2 | 6/2007 | Wang et al. |
| 7,245,007 B1 | 7/2007 | Foster |
| 7,247,933 B2 | 7/2007 | Juskey et al. |
| 7,253,493 B2 | 8/2007 | Wang et al. |
| 7,259,435 B2 | 8/2007 | Wang |
| 7,285,442 B2 | 10/2007 | Moden et al. |
| 7,285,848 B2 | 10/2007 | Onodera et al. |
| 7,285,971 B2 | 10/2007 | Yee et al. |
| 7,290,080 B2 | 10/2007 | Patel |
| 7,314,812 B2 | 1/2008 | Wang |
| 7,327,020 B2 | 2/2008 | Kwon |
| 7,339,257 B2 | 3/2008 | Ozawa et al. |
| 7,341,881 B2 | 3/2008 | Watkins et al. |
| 7,344,917 B2 * | 3/2008 | Gautham .................. 438/106 |
| 7,348,215 B2 | 3/2008 | Lee |
| 7,537,959 B2 * | 5/2009 | Lee et al. .................. 438/106 |
| 7,589,410 B2 * | 9/2009 | Kim .......................... 257/686 |
| 7,759,785 B2 * | 7/2010 | Corisis et al. ............. 257/690 |
| 7,781,877 B2 * | 8/2010 | Jiang et al. ............... 257/686 |
| 2001/0006828 A1 | 7/2001 | McMahon |
| 2003/0205826 A1 | 11/2003 | Lin et al. |
| 2003/0209787 A1 | 11/2003 | Kondo et al. |
| 2004/0042190 A1 | 3/2004 | Eng et al. |
| 2004/0253762 A1 * | 12/2004 | Lee .......................... 438/109 |
| 2005/0054141 A1 | 3/2005 | Kim et al. |
| 2005/0090050 A1 | 4/2005 | Shim et al. |
| 2005/0253211 A1 * | 11/2005 | Minamio et al. ........... 257/432 |
| 2005/0258853 A1 | 11/2005 | Sorimachi |
| 2005/0275750 A1 | 12/2005 | Akram et al. |
| 2006/0071314 A1 | 4/2006 | Ho et al. |
| 2006/0108676 A1 | 5/2006 | Punzalan, Jr. et al. |
| 2006/0113598 A1 | 6/2006 | Chen et al. |
| 2006/0118933 A1 | 6/2006 | Haba |
| 2006/0186514 A1 | 8/2006 | Shim et al. |
| 2006/0194373 A1 | 8/2006 | Fee et al. |
| 2006/0220208 A1 | 10/2006 | Onodera et al. |
| 2006/0220209 A1 | 10/2006 | Karnezos et al. |
| 2007/0004089 A1 | 1/2007 | Ebihara et al. |
| 2007/0007641 A1 | 1/2007 | Lee et al. |
| 2007/0048969 A1 | 3/2007 | Kwon et al. |
| 2007/0132081 A1 | 6/2007 | Wang et al. |
| 2007/0145556 A1 | 6/2007 | Bolken et al. |
| 2007/0166876 A1 | 7/2007 | Kim et al. |
| 2007/0190690 A1 | 8/2007 | Chow et al. |
| 2007/0210443 A1 | 9/2007 | Merilo et al. |
| 2007/0290318 A1 | 12/2007 | Tao et al. |
| 2008/0026506 A1 | 1/2008 | Kim et al. |
| 2008/0042252 A1 | 2/2008 | Moden et al. |
| 2008/0048301 A1 | 2/2008 | Wang et al. |
| 2008/0048302 A1 | 2/2008 | Lee et al. |
| 2008/0054432 A1 | 3/2008 | Corisis et al. |

FOREIGN PATENT DOCUMENTS

| | | |
|---|---|---|
| JP | 55128835 | 10/1980 |
| JP | 56004241 | 1/1981 |
| JP | 60094744 | 5/1985 |
| JP | 60178651 | 9/1985 |
| JP | 62109326 | 5/1987 |
| JP | 62115834 | 5/1987 |
| JP | 62261133 | 11/1987 |
| JP | 02306639 | 12/1990 |
| JP | 04157758 | 5/1992 |
| JP | 2004312008 | 4/2004 |
| JP | 2007288189 | 1/2007 |
| KR | 1062512 | 7/2001 |
| TW | 0242869 | 11/2005 |
| TW | 0255023 | 5/2006 |
| TW | 278947 | 4/2007 |
| WO | 0070676 | 11/2000 |
| WO | 2005083789 | 9/2005 |

OTHER PUBLICATIONS

Imoto et al., Development of 3-Dimensional Module Package, "System Block Module", 2001 Electronic Components and Technology Conference, Publication Date, May 29-Jun. 1, 2001, pp. 552-557.

Pienimaa et al., Stacked Modular Package, Advanced Packaging, IEEE Transactions, Publication Date, Aug. 2004, vol. 27, Issue 3, pp. 461-466.

Mita et al., Advanced TAB/BGA Multi-Chip Stacked Module for High Density LSI Packages, IEEE, Multi-Chip Module Conference, 1994, Publication Date Mar. 15-17, 1994, pp. 68-76.

Ammann et al., Multichip Packaging in QFPs by PBO-Multilayer High Density Interconnect, 1998 International Conference on Multichip Modules and High Density Packaging, Publication Date, Apr. 15-17, 1998, pp. 29-34.

Rencz, Thermal Qualification of 3D Stacked Die Structures, Budapest University of Technology and Economics, Department of Electron Devices, 2006.

Search Report for Singapore Application No. 200803157-7, mailed Aug. 25, 2009, eight (8) pages.

* cited by examiner

_US 8,072,082 B2_

PRE-ENCAPSULATED CAVITY INTERPOSER

CROSS-REFERENCE TO RELATED APPLICATIONS

The subject matter of this application is related to U.S. patent application Ser. No. 11/874,531, filed Oct. 18, 2007, now U.S. Pat. No. 7,829,991, issued Nov. 9, 2010, which is a divisional of U.S. patent application Ser. No. 11/063,403, filed Feb. 22, 2005, now U.S. Pat. No. 7,285,442, issued Oct. 23, 2007, which is a continuation of U.S. patent application Ser. No. 10/706,210, filed Nov. 12, 2003, now U.S. Pat. No. 6,858,926, issued Feb. 22, 2005, which is a divisional of U.S. patent application Ser. No. 09/924,635, filed Aug. 8, 2001, now U.S. Pat. No. 6,650,007, issued Nov. 18, 2003, which is a continuation of U.S. patent application Ser. No. 09/344,279, filed Jun. 30, 1999, now U.S. Pat. No. 6,297,548, issued Oct. 2, 2001, which claims the benefit of U.S. Provisional Application No. 60/091,205 filed Jun. 30, 1998.

TECHNICAL FIELD

This invention relates generally to connectors for high density semiconductor device configurations using a pre-encapsulated cavity interposer.

BACKGROUND

In response to the demand for semiconductor device packages having the ability to include the largest number of semiconductor devices in the smallest physical space, all components of such packages must occupy the least possible physical volume and use the most efficient manner to interconnect with each other and a power source.

It is known to form packages for semiconductor devices that include semiconductor memory devices of different types as well as other semiconductor devices with the package being connected to a printed circuit board. As it has become desirable for the amount of physical space that the package occupies to decrease, even though the number of semiconductor devices in the package is increasing, and desirable to have improvements in attachment techniques used for attaching the semiconductor devices to each other in the package itself and the attachment of the package to a printed circuit board are necessary.

While the use of lead frames and wire bonds to connect semiconductor devices is well known, such techniques can be further advanced. Similarly, while the use of lead frames and flip-chip type attachment techniques to connect semiconductor devices is well known, such techniques can be further advanced. Additionally, while the use of solder bumps to connect semiconductor packages in packages to printed circuit boards is well known, such can be further advanced.

SUMMARY OF THE INVENTION

A pre-encapsulated cavity interposer, a pre-encapsulated frame, for a semiconductor device.

DETAILED DESCRIPTION OF THE INVENTION

Figure 1:
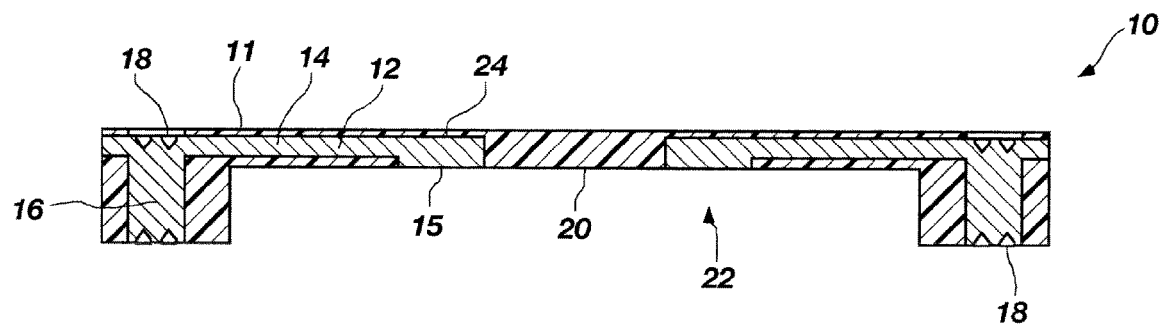
FIG. 1 is a cross-sectional view of a pre-encapsulated frame.

Referring to drawing FIG. 1, a pre-encapsulated cavity interposer 10, hereinafter referred to as a pre-encapsulated frame 10, is illustrated in cross section. The pre-encapsulated cavity frame 10 comprises a pre-encapsulated member 11, the frame 10, formed of encapsulating compound 20 having any desired configuration for a semiconductor device to be retained in the member 11 in a cavity 22 therein and having a plurality of traces 12 including a first portion 14, typically extending horizontally, having any desired shape and configuration, such as rectangular, square, etc., and a second portion 16, typically extending orthogonally from the first portion 14, although they may extend at any desired angle, as a post like structure having any desired shape and configuration, such as round, rectangular, square, hexagonal, triangular, elliptical, u-shaped, c-shaped, curved in cross-sectional shape, etc. As many second portions 16 of a trace 12 may be attached in serial fashion to the first portion 14 of a trace 12, which are illustrated herein. The traces 12 include connection areas 18 formed in the ends of the second portions 16, which may include grooves therein or roughened surfaces thereon, as desired, for enhanced joint connections, although the connection areas 18 ends may be smooth, an encapsulating compound 20 covering portions of the traces 12, and a cavity 22 formed by the traces 12 and encapsulation material 20 of the frame 11 for the installation of any desired number, shapes, and types of semiconductor devices therein. The cavity 22 surrounds and encloses any semiconductor device or semiconductor devices installed therein on the top and sides thereof. The cavity 22 having a desired size and a thickness essentially that approximate the semiconductor device to be installed therein, although the cavity 22 can be any desired size and thickness for use with different types of semiconductor devices to be installed therein.

The traces 12 may be formed of any suitable metal material, such as copper, copper alloy, etc., of any desired thickness of metal material suitable for the application of the pre-encapsulated cavity interposer 10. Any desired metal coating, such as a layer of gold, silver, nickel, palladium, alloys thereof, etc., and/or any desired coating of material may be used on the traces 12 at any desired location thereon for any purpose. The encapsulating material 20 may be of any suitable type for the application for the pre-encapsulated cavity interposer 10 and may contain any suitable amount of filler material and other additives therein, if desired for the formation of the pre-encapsulated frame 11. The encapsulation material 20 surrounds each trace 12 insulating the trace 12 while providing a suitable connection area 15 on the first portion 14 for connection to a semiconductor device and connection areas 18 on the second portion. The connection area 15 may include any desired layers of metal thereon, such as gold, silver, nickel, palladium, alloys thereof, etc. A surface 24 formed opposite of the cavity 22 of the pre-encapsulated cavity interposer 10 is generally planar having areas free of encapsulation material for the connection areas 18 of the second portions 16 of the traces 12. If desired, the surface 24 may include other areas free of encapsulation material 10 for connection areas for the first portion 14 of a trace 12 (not shown) so that both the first portion 14 and second portion 16 of a trace may include connection areas on the upper and lower surfaces thereof. Similarly, if desired, the surface 24 may have a cavity of any desired sized and shape, such as cavity 22, formed therein (not shown).

The pre-encapsulated cavity frame 10 may be formed in strip form of any desired length and configuration pattern or in panel forms having any desired geometric shape and physical size. The pre-encapsulated cavity frame 10 is constructed using a base material (not shown), having the traces 12 patterned on the base material having any size, pitch, pattern, shape, thickness, length, etc., with the encapsulation material 20 providing support for the traces 12 being applied thereover. After the formation of the pre-encapsulated cavity interposer 10 on the base material, the base material is removed leaving the pre-encapsulation frame 10. The pre-encapsulated cavity frame 10 may be formed for stacking of multiple pre-encapsulation frames having any desired number of semiconductor devices therein one on top the other being electrically interconnected by the connection areas 18 of the ends of the second portions 16 of the traces 12 contacting each other as desired.

Figure 1A:
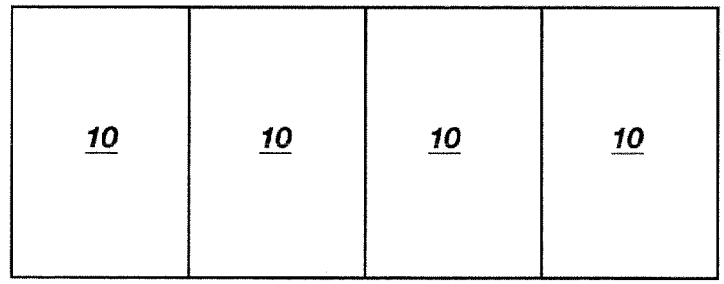
FIG. 1A is a view of a portion of a strip of pre-encapsulated frames.

Referring to drawing FIG. 1A, illustrated in a top view is a portion of a strip of pre-encapsulation frames 10, which may be cut or severed into individual pre-encapsulation frames 10 at any desired time of use.

Figure 1B:
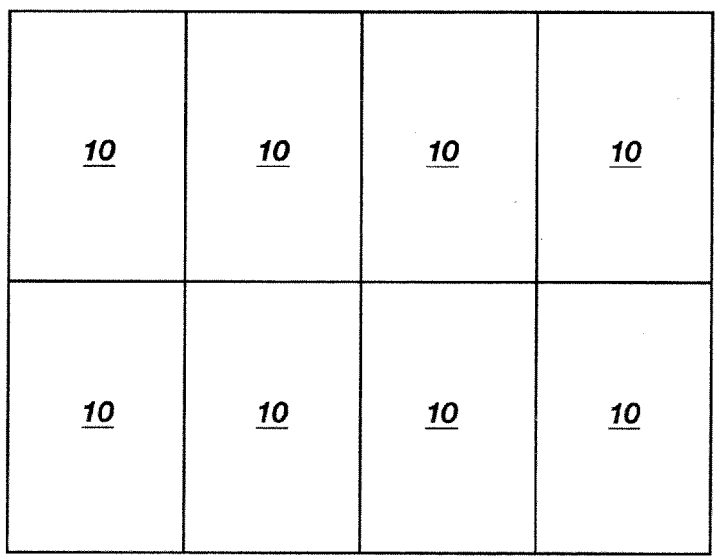
FIG. 1B is a view of a portion of a panel of pre-encapsulated frames.

Referring to drawing FIG. 1B, illustrated in a top view is a portion of a panel of pre-encapsulation frames 10, which may be cut or severed into individual pre-encapsulation frames 10 at any desired time of use.

Figure 2:
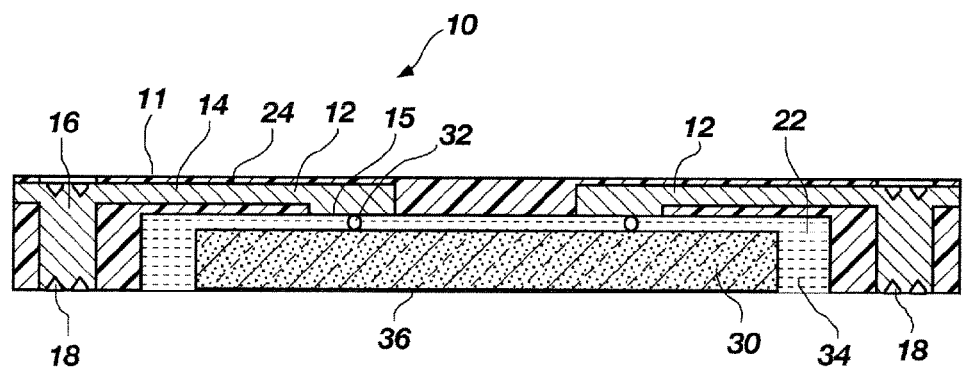
FIG. 2 is a cross-sectional view of a pre-encapsulated frame having a semiconductor device installed therein.

Referring to drawing FIG. 2, the pre-encapsulated cavity frame 10 is illustrated in cross section having a flip-chip type semiconductor device 30 attached to connection areas 15 of the first portions 14 of a leads 12 using solder balls 32, or solder bumps, solder stud bumps, or gold stud bumps located between bond pads of the semiconductor device 30 and the connection areas 15. The cavity 22 of the pre-encapsulated cavity frame 10 having the semiconductor device 30 located therein is filled with any suitable liquid encapsulant material, underfill material, etc., to retain and environmentally seal the semiconductor device 30 in the cavity 22 forming an essentially planar lower surface 36 opposite the surface 24 of the pre-encapsulated cavity interposer 10 at essentially the same level as that of the lower surface 18 of the second portion 16 of traces 12.

Figure 2A:
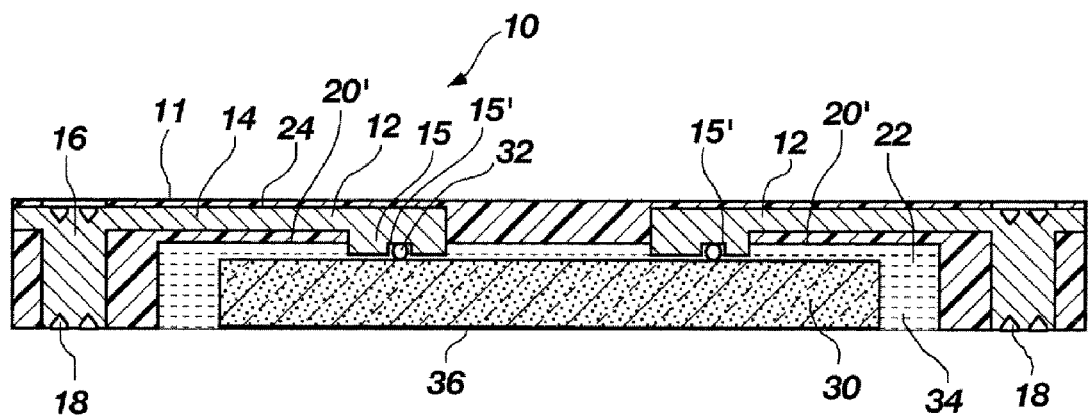
FIG. 2A is a cross-sectional view of an alternative pre-encapsulated frame having a semiconductor device installed therein.

Referring to drawing FIG. 2A, the pre-encapsulated cavity frame 10 is illustrated in cross section having a flip-chip type semiconductor device 30 attached to connection areas 15, which extend below the lower surface 20' of the encapsulant material 20 covering the lower surface 18 of the second portion 16 of the traces 12 having one or more grooves or recesses 15' therein of the first portions 14 of a leads 12 using solder balls 32, or solder bumps, solder stud bumps, or gold stud bumps located between bond pads of the semiconductor device 30 and the connection areas 15. The one or more grooves or recesses 15' in the connection areas facilitate the location of the semiconductor device 30 in the cavity 22 in the proper location with respect to connection areas 15 using conventional semiconductor device attachment equipment. The one or more grooves or recesses 15' may be formed having any suitable geometric shape and desired depth in the connections areas 15 by any suitable method, such as etching, coining, laser forming, etc. The cavity 22 of the pre-encapsulated cavity frame 10 having the semiconductor device 30 located therein is filled with any suitable liquid encapsulant material, underfill material, etc., to retain and environmentally seal the semiconductor device 20 in the cavity 22 forming an essentially planar lower surface 36 opposite the surface 24 of the pre-encapsulated cavity interposer 10 at essentially the same level as that of the lower surface 18 of the second portion 16 of traces 12.

Figure 2B:
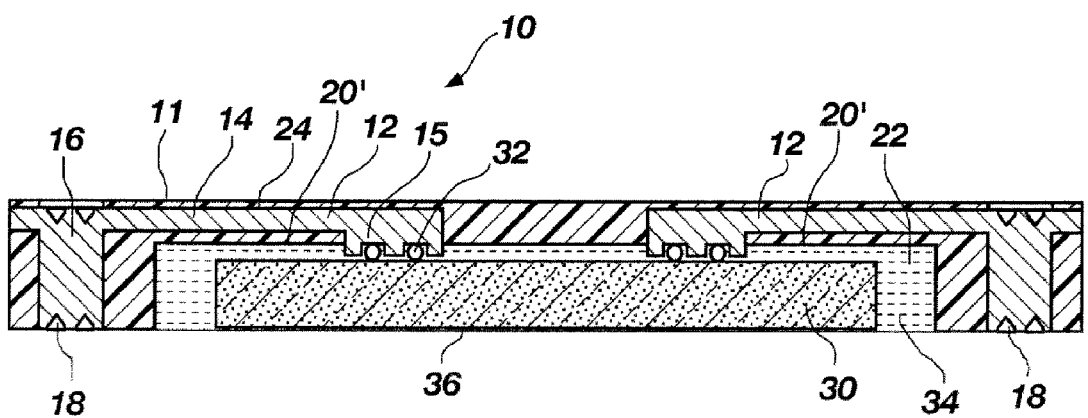
FIG. 2B is a cross-sectional view of an alternative pre-encapsulated frame having a semiconductor device installed therein.

Referring to drawing FIG. 2B, the pre-encapsulated cavity frame 10 is illustrated in cross section having a flip-chip type semiconductor device 30 attached to connection areas 15, which extend below the lower surface 20' of the encapsulant material 20 covering the lower surface 18 of the second portion 16 of the traces 12 having two or more grooves or recesses 15' therein of the first portions 14 of a leads 12 using two or more solder balls 32, or solder bumps, solder stud bumps, or gold stud bumps located between bond pads of the semiconductor device 30 and the connection areas 15. The two or more grooves or recesses 15' in the connection areas facilitate the location of the semiconductor device 30 in the cavity 22 in the proper location with respect to connection areas 15 using conventional semiconductor device attachment equipment. The two or more grooves or recesses 15' may be formed having any suitable geometric shape and desired depth in the connections areas 15 by any suitable method, such as etching, coining, laser forming, etc. The cavity 22 of the pre-encapsulated cavity frame 10 having the semiconductor device 30 located therein is filled with any suitable liquid encapsulant material, underfill material, etc., to retain and environmentally seal the semiconductor device 20 in the cavity 22 forming an essentially planar lower surface 36 opposite the surface 24 of the pre-encapsulated cavity interposer 10 at essentially the same level as that of the lower surface 18 of the second portion 16 of traces 12.

Figure 2C:
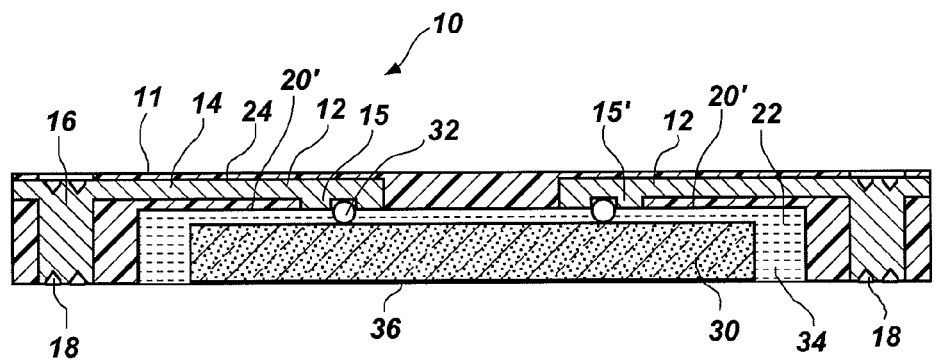
FIG. 2C is a cross-sectional view of an alternative pre-encapsulated frame having a semiconductor device installed therein.

Referring to drawing FIG. 2C, the pre-encapsulated cavity frame 10 is illustrated in cross section having a flip-chip type semiconductor device 30 attached to connection areas 15, which are located at essentially the same level as the lower surface 20' of the encapsulant 20 having one or more grooves or recesses 15' therein of the first portions 14 of a leads 12 using solder balls 32, or solder bumps, solder stud bumps, or gold stud bumps located between bond pads of the semiconductor device 30 and the connection areas 15. The one or more grooves or recesses 15' in the connection areas facilitate the location of the semiconductor device 30 in the cavity 22 in the proper location with respect to connection areas 15 using conventional semiconductor device attachment equipment. The one or more grooves or recesses 15' may be formed having any suitable geometric shape and desired depth in the connections areas 15 by any suitable method, such as etching, coining, laser forming, etc. The cavity 22 of the pre-encapsulated cavity frame 10 having the semiconductor device 30 located therein is filled with any suitable liquid encapsulant material, underfill material, etc., to retain and environmentally seal the semiconductor device 20 in the cavity 22 forming the essentially planar lower surface 36 opposite the surface 24 of the pre-encapsulated cavity interposer 10 at essentially the same level as that of the lower surface 18 of the second portion 16 of traces 12.

Figure 2D:
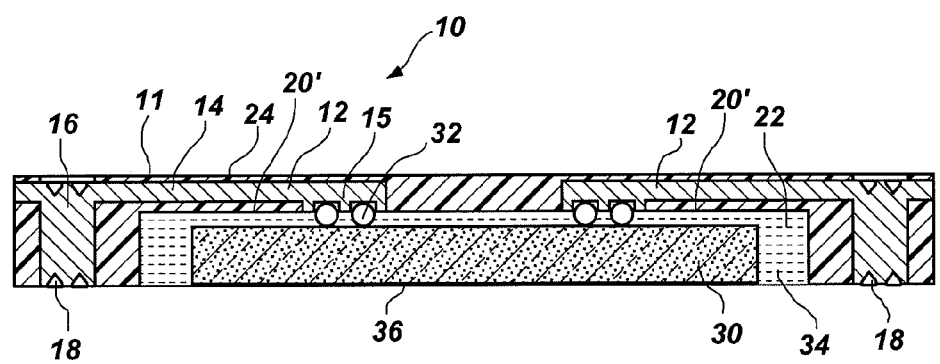
FIG. 2D is a cross-sectional view of an alternative pre-encapsulated frame having a semiconductor device installed therein.

Referring to drawing FIG. 2D, the pre-encapsulated cavity frame 11 is illustrated in cross section having a flip-chip type semiconductor device 30 attached to connection areas 15, which extend below the lower surface 20' of the encapsulant material 20 covering the lower surface 18 of the second portion 16 of the traces 12 having two or more grooves or recesses 15' therein of the first portions 14 of a leads 12 using two or more solder balls 32, or solder bumps, solder stud bumps, or gold stud bumps located between bond pads of the semiconductor device 30 and the connection areas 15. The two or more grooves or recesses 15' in the connection areas facilitate the location of the semiconductor device 30 in the cavity 22 in the proper location with respect to connection areas 15 using conventional semiconductor device attachment equipment. The two or more grooves or recesses 15' may be formed having any suitable geometric shape and desired depth in the connections areas 15 by any suitable method, such as etching, coining, laser forming, etc. The cavity 22 of the pre-encapsulated cavity frame 10 having the semiconductor device 30 located therein is filled with any suitable liquid encapsulant material, underfill material, etc., to retain and environmentally seal the semiconductor device 20 in the cavity 22 forming an essentially planar lower surface 36 opposite the surface 24 of the pre-encapsulated cavity interposer 10 at essentially the same level as that of the lower surface 18 of the second portion 16 of traces 12.

Figure 2E:
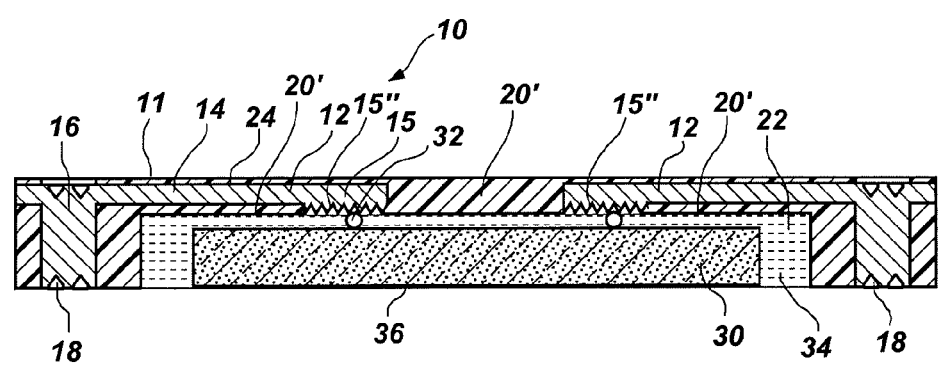
FIG. 2E is a cross-sectional view of an alternative pre-encapsulated frame having a semiconductor device installed therein.

Referring to drawing FIG. 2E, the pre-encapsulated cavity frame 10 is illustrated in cross section having a flip-chip type semiconductor device 30 attached to connection areas 15, which are located at essentially the same level as the lower surface 20' of the encapsulant 20 having a roughened surface 15" therein of the first portions 14 of a leads 12 using solder balls 32, or solder bumps, solder stud bumps, or gold stud bumps located between bond pads of the semiconductor device 30 and the connection areas 15. The roughened surface 15" in the connection areas 15 facilitate the location of the semiconductor device 30 in the cavity 22 in the proper location with respect to connection areas 15 using conventional semiconductor device attachment equipment. The roughened surface 15" may be formed having any suitable geometric shape and desired depth in the connections areas 15 by any suitable method, such as etching, coining, laser forming, etc. The cavity 22 of the pre-encapsulated cavity frame 10 having the semiconductor device 30 located therein is filled with any suitable liquid encapsulant material, underfill material, etc., to retain and environmentally seal the semiconductor device 20 in the cavity 22 forming an essentially planar lower surface 36 opposite the surface 24 of the pre-encapsulated cavity interposer 10 at essentially the same level as that of the lower surface 18 of the second portion 16 of traces 12.

Figure 3:
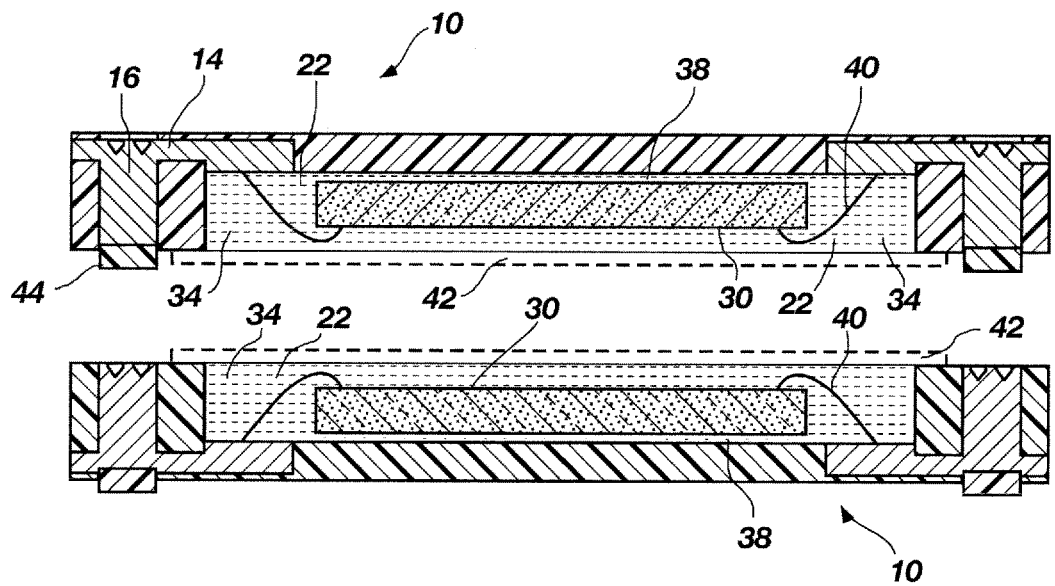
FIG. 3 is a cross-sectional view of two stacked pre-encapsulated frames each having a semiconductor device installed therein and connected using bond wires.

Referring to drawing FIG. 3, a pair of pre-encapsulated cavity frames 10 are illustrated in cross section, each having a semiconductor device 30 located in cavity 22. Each semiconductor device 20 is attached to the encapsulation material 20 using a suitable adhesive 38, which may be either a layer of adhesive or a double-sided adhesive tape, to retain the semiconductor device 20 in the cavity 22 prior to the filling of the cavity 22 with any suitable liquid encapsulant material, underfill material, etc., to retain and environmentally seal the semiconductor device 20 in the cavity 22 forming an essentially planar lower surface 36 opposite the surface 24 of the pre-encapsulated cavity frame 10 at essentially the same level as that of the lower surface 18 of the second portion 16 of traces 12. As illustrated, the first portions of the traces 12 are connected to the bond pads of the semiconductor device 30 using bond wires 40, rather than a flip-chip style type of attachment. If desired, an anisotropic conductive film 42 (shown in dashed lines) or non-conductive film 42 (shown in dashed lines) may be used to seal the semiconductor device in the cavity 22 without the use of an encapsulant material 34 in the cavity 22. A solder paste 44 may be applied to the connection areas 18 of the second portion of traces 12 for reflow and connection of the pre-encapsulated cavity interposers 10.

Figure 4:
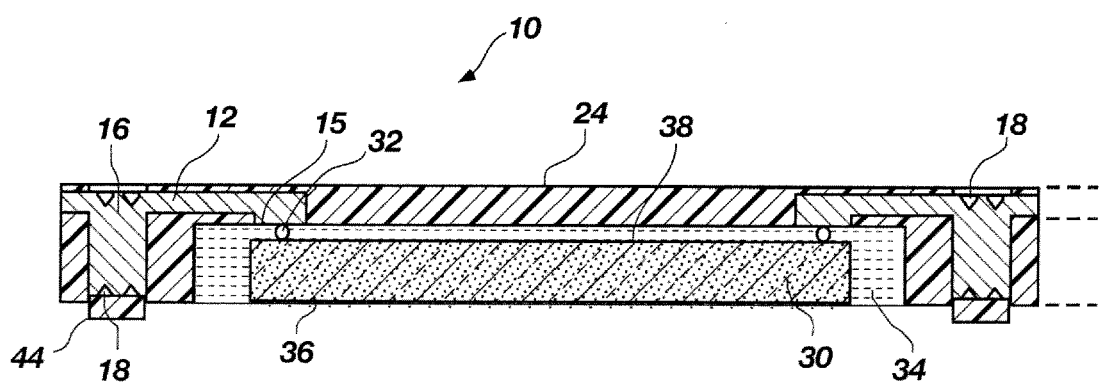
FIG. 4 is a cross-sectional view of a pre-encapsulated frame having a semiconductor device installed therein having two sides of bond pads on the active surface thereof.

Referring to drawing FIG. 4, the pre-encapsulation frame 10 is illustrated in cross section having a flip-chip type semiconductor device 30 having bond pads on the active surface thereof about two sides of the semiconductor device 30 attached to the first portion 14 of the traces 12 with the cavity 22 filled with any suitable liquid encapsulant material, underfill material, etc., to retain and seal the semiconductor device 20 in the cavity 22 forming an essentially planar lower surface 36 opposite the surface 24 of the pre-encapsulated cavity frame 10 at essentially the same level as that of the lower surface 18 of the second portion 16 of traces 12. If desired, a layer of adhesive or a double sided adhesive tape 38 may be used to retain the semiconductor device 30 in the cavity 22 prior to the reflow of the solder balls 32 to attach the semiconductor device 30 to the connection areas 15 of the first portion 14 of the traces 12.

Figure 5:
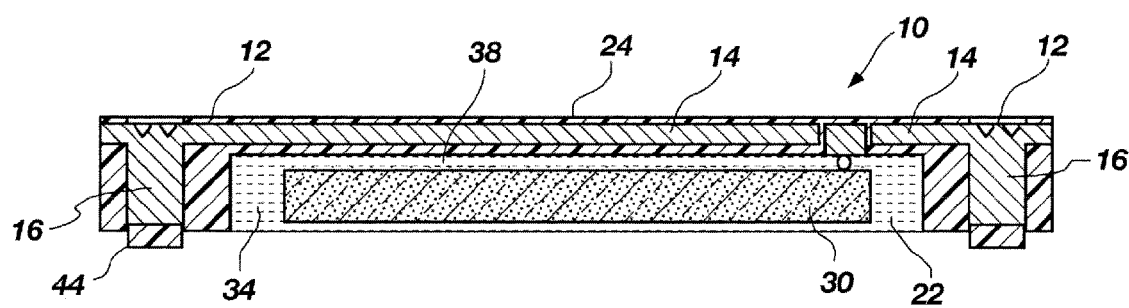
FIG. 5 is a cross-sectional view of a pre-encapsulated frame having a semiconductor device installed therein having one side of bond pads on the active surface thereof.

Referring to drawing FIG. 5, the pre-encapsulated cavity frame 10 is illustrated in cross section configured to a semiconductor device 30 having bond pads on the active surface thereof along one side thereof. The traces 12 are formed in a pattern so that a first portion 14 of one trace is longer than the first portion 14 of another trace 12 to connect to a desired bond pad on the semiconductor device 30 in a flip-chip style type of arrangement described hereinbefore.

Figure 5A:
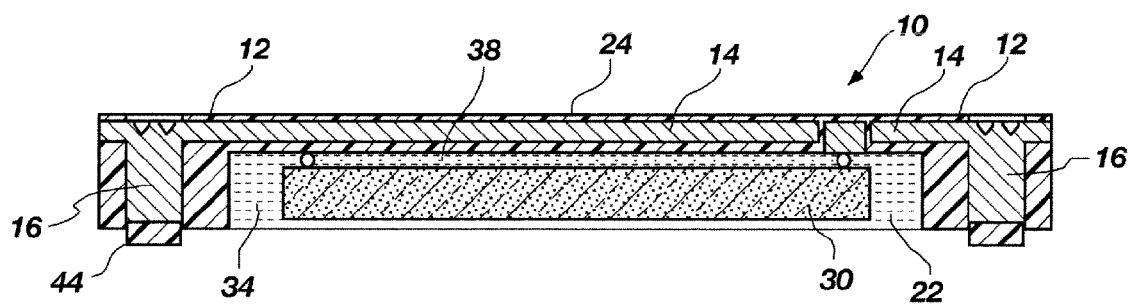
FIG. 5A is a cross-sectional view of a pre-encapsulated frame having a semiconductor device installed therein having 1.5 sides of bond pads on the active surface thereof.

Referring to drawing FIG. 5A the pre-encapsulated cavity frame 10 is illustrated in cross section configured to a semiconductor device 30 having bond pads on the active surface thereof in a 1.5 sided configuration as known in the art. The traces 12 are formed in a pattern so that a first portion 14 of one trace is longer than the first portion 14 of another trace 12 to connect to a desired bond pad on the semiconductor device 30 in a flip-chip style type of arrangement described hereinbefore.

Figure 5B:
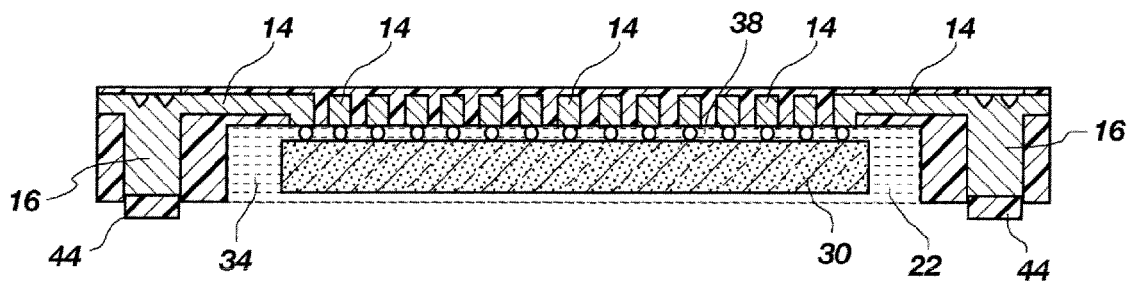
FIG. 5B is a cross-sectional view of a pre-encapsulated frame having a semiconductor device installed therein having one side of bond pads on the active surface thereof along the long side of the semiconductor device.

Referring to drawing FIG. 5B, the pre-encapsulated cavity frame 10 is illustrated in cross section configured to a semiconductor device 30 having bond pads on the active surface thereof solely along the long side of the semiconductor device 20. The traces 12 are formed to in a pattern to vary in length and configuration so that the first portion 14 of a trace connects to a desired bond pad of the semiconductor device 30 in a flip-chip style type arrangement described hereinbefore.

Figure 5C:
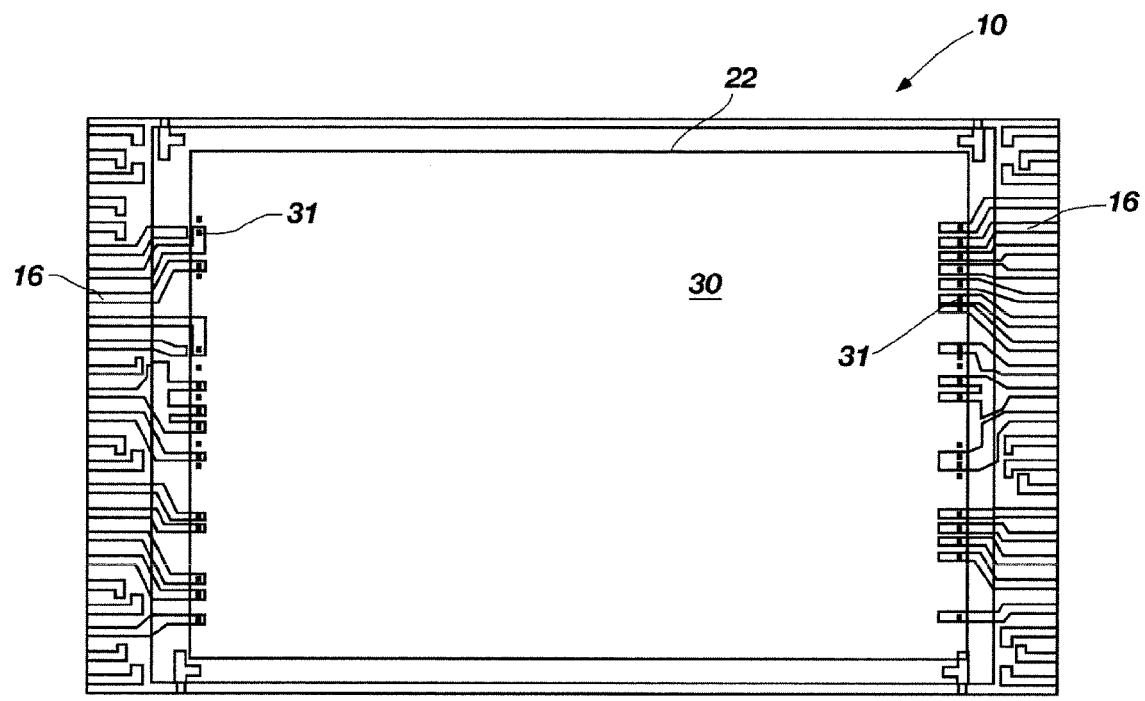
FIG. 5C is a plan view of a pre-encapsulated frame for a semiconductor device having two sides of bond pads on the active surface thereof.

Referring to drawing FIG. 5C, a pre-encapsulated cavity frame 10 is illustrated in a plan view to show the layout of the traces 12 for a 2-sided bond pad configuration for a semiconductor device 30 having bond pads on the active surface thereof located on two sides of the semiconductor device 30. As illustrated the second portions 16 of the traces 12 extend from each side of the pre-encapsulated cavity interposer 10 to extend over bond pads 31 located on the semiconductor die 30. The pre-encapsulated frame 10 is typically used for a semiconductor device 30 such as described in drawing FIG. 4.

Figure 5D:
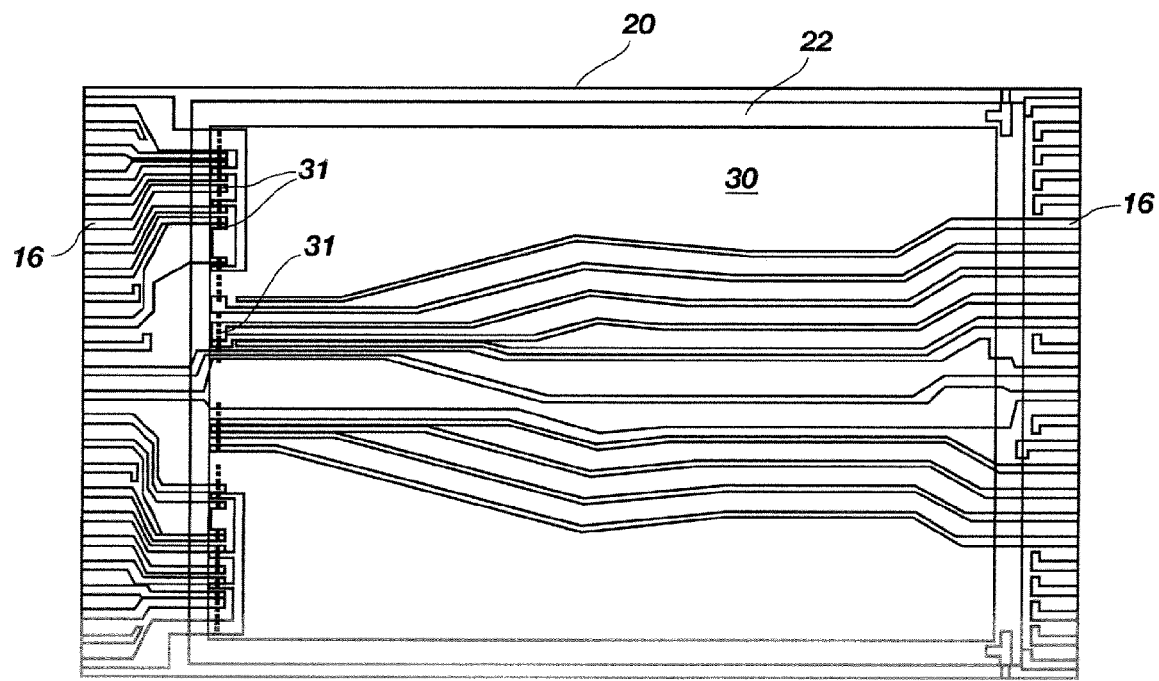
FIG. 5D is a plan view of a pre-encapsulated frame for a semiconductor device having one side of bond pads on the active surface thereof.

Referring to drawing FIG. 5D, a pre-encapsulated cavity frame 10 is illustrated in plan view to show the layout of the traces 12 for a 1-sided bond pad configuration for a semiconductor device 30 having bond pads on the active surface thereof located on one side of the semiconductor device 30. As illustrated the second portions 16 of the traces 12 extend from each side of the pre-encapsulated cavity frame 10 to extend over the bond pads 31 located on the semiconductor die 30. The pre-encapsulated cavity frame 10 is typically used for a semiconductor device 30 such as described in drawing FIG. 5.

Figure 5E:
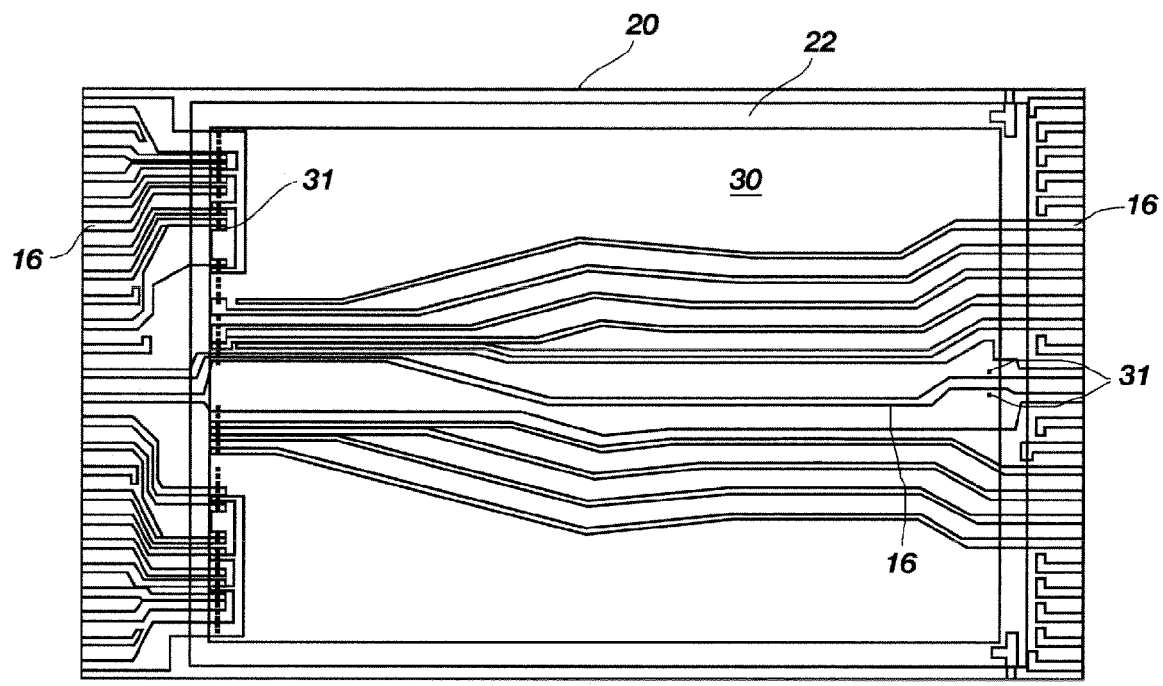
FIG. 5E is a plan view of a pre-encapsulated frame for a semiconductor device having 1.5 sides of bond pads on the active surface thereof.

Referring to drawing FIG. 5E, a pre-encapsulated cavity frame 10 is illustrated in plan view to show the layout of the traces 12 for a 1.5-sided bond pad configuration for a semiconductor device 30 having bond pads on the active surface thereof located on 1.5 sides of the semiconductor device 30. As illustrated the second portions 16 of the traces 12 extend from each side of the pre-encapsulated frame 10 to extend over the bond pads 31 located on the semiconductor die 30. The pre-encapsulated frame 10 is typically used for a semiconductor device 30 such as described in drawing FIG. 5A.

Figure 5F:
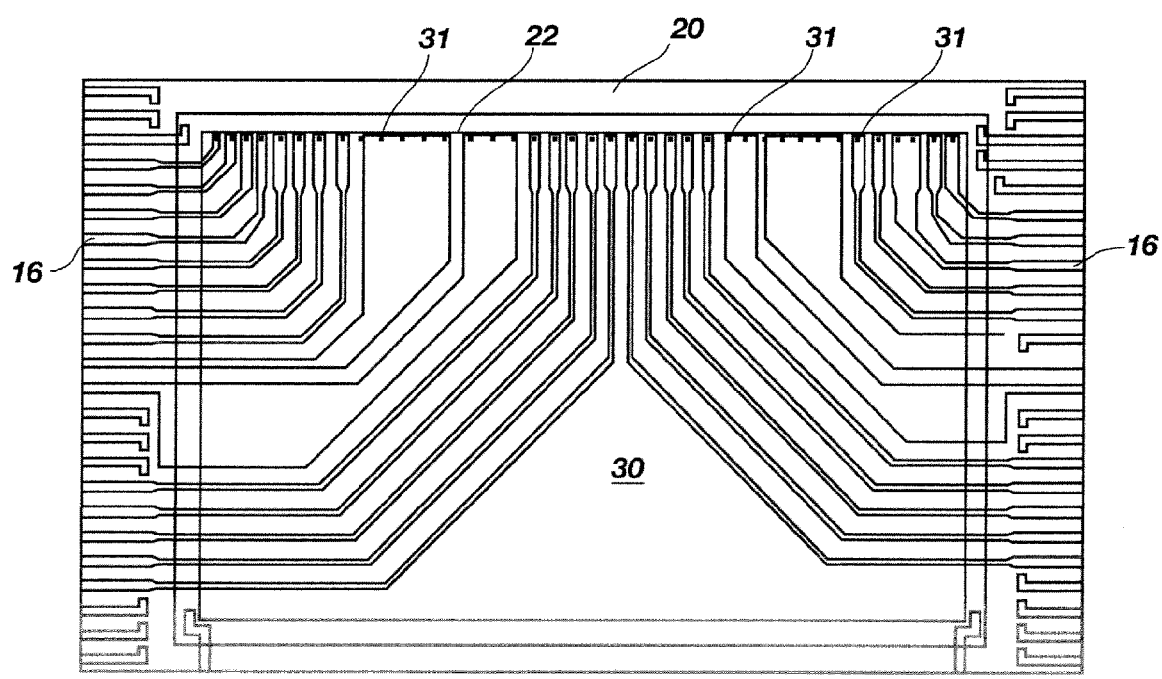
FIG. 5F is a plan view of a pre-encapsulated frame for a semiconductor device having one side of bond pads on the active surface thereof along the long side of the semiconductor device.

Referring to drawing FIG. 5F, a pre-encapsulated frame 10 is illustrated in plan view to show the layout of the traces 12 for a 1-sided bond pad configuration for a semiconductor device 30 having bond pads on the active surface thereof located on a long side of the semiconductor device 30. As illustrated the second portions 16 of the traces 12 extend from each side of the pre-encapsulated cavity interposer 12 to extend over the bond pads 31 located on the semiconductor die 30. The pre-encapsulated frame 10 is typically used for a semiconductor device 30 such as described in drawing FIG. 5B.

Figure 6:
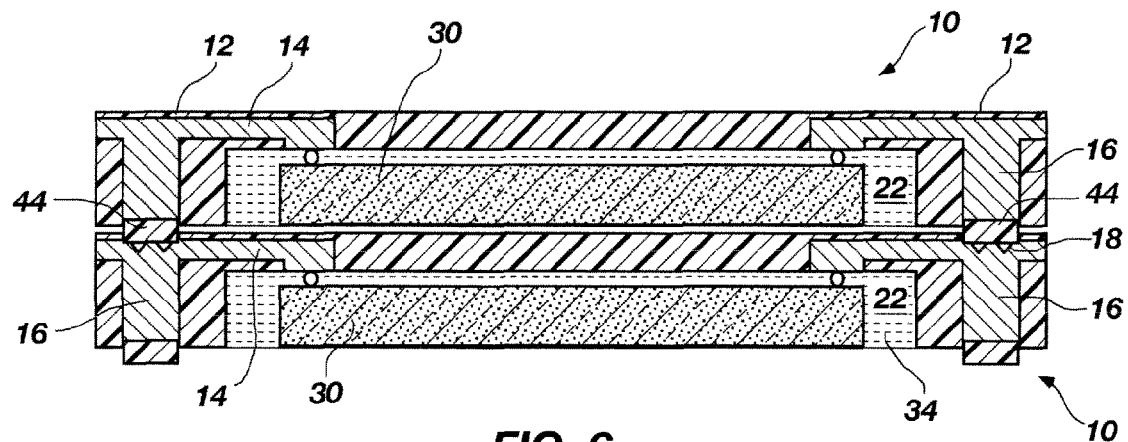
FIG. 6 is a cross-sectional view of two stacked pre-encapsulated frames having semiconductor devices installed therein being interconnected in a DDP arrangement.

Referring to drawing FIG. 6, the pre-encapsulation frame 10 is illustrated in cross section where two pre-encapsulation frames 10 are stacked and connected in DDP form by reflowed solder paste 44 connecting the connecting surfaces 18 of the second portions 16 of the traces 12. The semiconductor devices 30 are attached to the first portions 14 of the traces 12 in a flip-chip style type of arrangement described hereinbefore.

Figure 7:
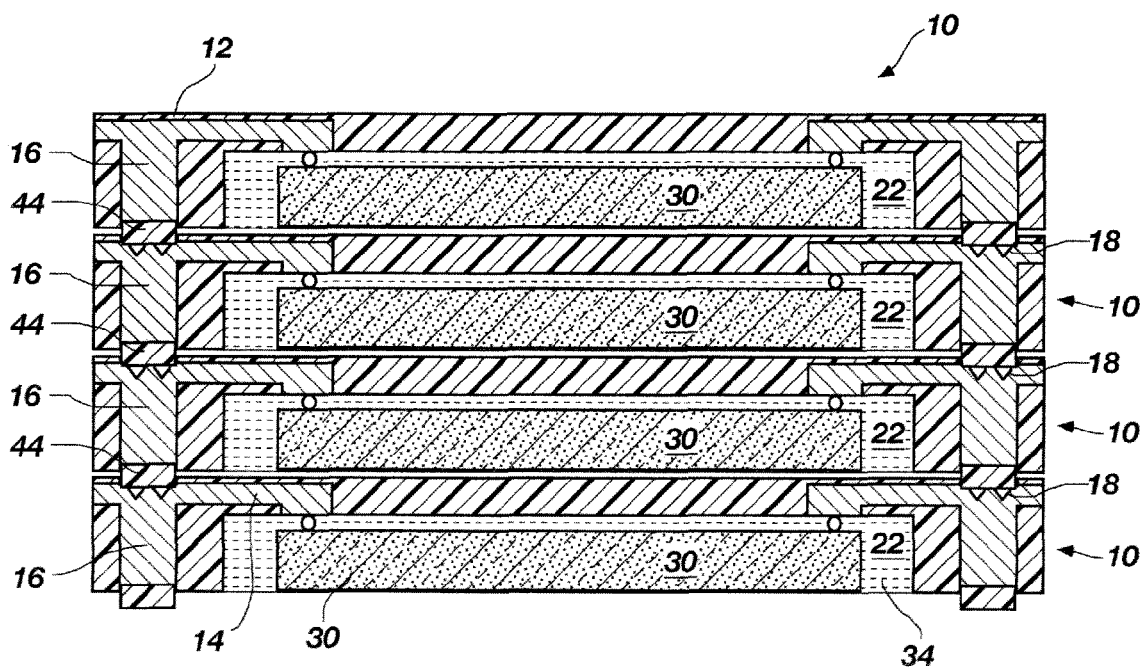
FIG. 7 is a cross-sectional view of four stacked pre-encapsulated frames having semiconductor devices installed therein being interconnected in a QDP arrangement.

Referring to drawing FIG. 7, the pre-encapsulation frame 10 is illustrated in cross section where four pre-encapsulation frames 10 are stacked and connected in QDP form by reflowed solder paste 44 connecting the connecting surfaces 18 of the second portions 16 of the traces 12. The semiconductor devices 30 are attached to the first portions 14 of the traces 12 in a flip-chip style type of arrangement described hereinbefore.

Figure 8:
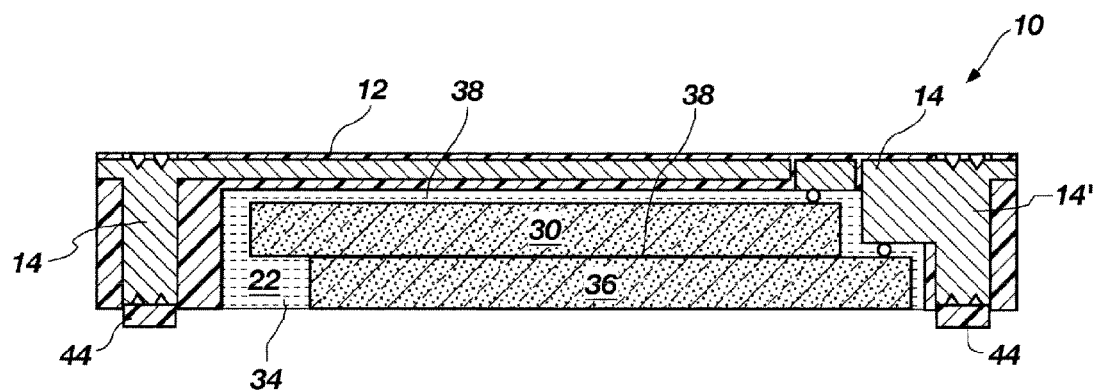
FIG. 8 is a cross-sectional view of a pre-encapsulated frame having two semiconductor devices installed therein in an offset arrangement.

Referring to drawing FIG. 8, the pre-encapsulation frame 10 is illustrated in cross section configured to connect to two semiconductor devices 30 having bond pads on the active surface thereof in a one-sided configuration as known in the art. The traces 12 are formed in a pattern so that a first portion 14 of one trace is longer than the first portion 14 of another trace 12 to connect to a desired bond pad on the semiconductor device 30 in a flip-chip style type of arrangement described hereinbefore. An adhesive 38 may attach the semiconductor device 30 to the encapsulated traces 12 and to each other. The semiconductor devices 30 are stacked having an offset from each other along the side of the semiconductor device 30 having the bond pads located there along. As illustrated, some of the traces 12 are formed having a stepped second portion 14' to attach to bond pads on one side of the lower semiconductor device 30.

Figure 8A:
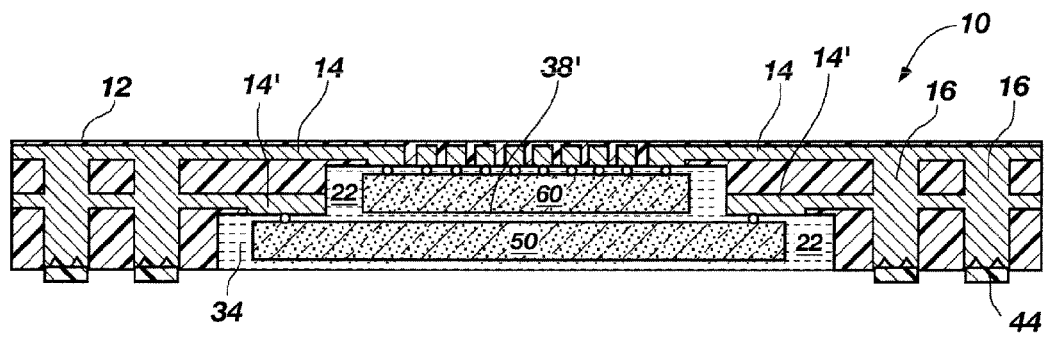
FIG. 8A is a cross-sectional view of a pre-encapsulated frame having two semiconductor devices installed therein in a stacked arrangement.

Referring to drawing FIG. 8A, the pre-encapsulation frame 10 is illustrated in cross section configured to connect to two semiconductor devices, a controller semiconductor device 60 and a NAND semiconductor device 50, each having bond pads on the active surface thereof as described herein as known in the art. The traces 12 are formed in a pattern so that an upper first portion 14 of one trace connects to bond pads of the controller semiconductor device 60 while the lower first portions 14' connect to bond pads on the active surface of a NAND semiconductor device 50 in flip-chip style types of arrangement described hereinbefore. An insulating adhesive or suitable insulating adhesive tape 38' may attach the semiconductor device 60 to the encapsulated traces 12 and to the semiconductor device 50. The semiconductor devices 30 are in a stacked arrangement with the pre-encapsulation frame 10 being thicker to accommodate two semiconductor devices therein with the cavity 22 being a stepped arrangement to accommodate two semiconductor devices having different sizes. The cavity 22 is filled and environmentally sealed with a suitable encapsulant 36.

Figure 9:
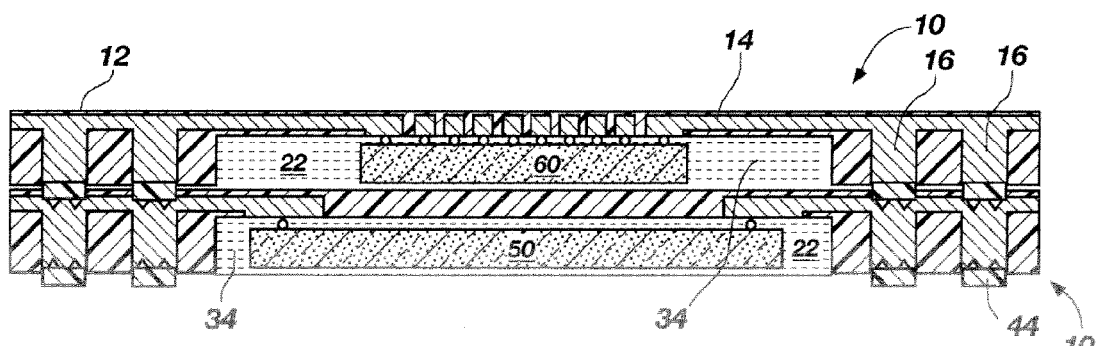
FIG. 9 is a cross-sectional view of two stacked interconnected pre-encapsulated frames, one frame having a DRAM semiconductor memory device installed therein and the other frame having a NAND semiconductor memory device installed therein.

Referring to drawing FIG. 9, the pre-encapsulation frame 10 is illustrated in cross section in a stacked and interconnected configuration for use with a semiconductor device 60, such as a controller semiconductor device known in the art, and another semiconductor device 50, such as a DRAM or NAND Flash memory type semiconductor device, is a stacked configuration. Both of the pre-encapsulation frames 10 have been formed having two second portions 16 for the traces 12. The upper pre-encapsulation frame 10 is formed having the first portions 14 of the traces 12 configured to attach to the bond pads of the semiconductor device 60, which are located solely along one side thereof, such as described in drawing FIG. 5B hereinbefore in a flip-chip style type arrangement. The lower pre-encapsulation frame 10 is formed with the first portions 14 of the traces 12 configured for attachment to the bond pads on the active surface of the semiconductor device 50, which are located along two sides thereof in a flip-chip style type arrangement as described herein.

Figure 10:
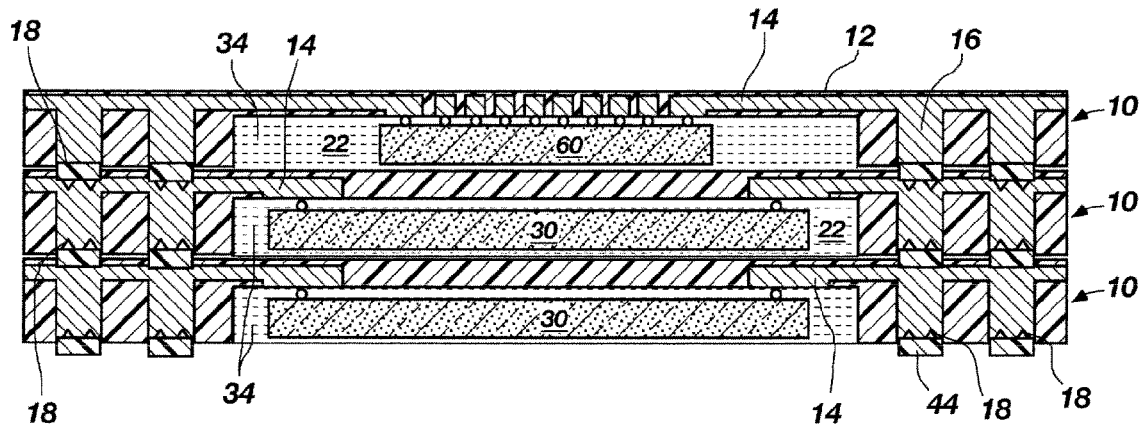
FIG. 10 is a cross-sectional view of three stacked interconnected pre-encapsulated frames, one frame having a controller semiconductor device installed therein and two frames having NAND semiconductor memory devices installed therein.

Referring to drawing FIG. 10, the pre-encapsulation frame 10 is illustrated in cross section in a stacked and interconnected configuration for use with a semiconductor device 60, such as a controller semiconductor device known in the art, and two semiconductor devices 30, such as a NAND Flash memory type semiconductor device. All of the pre-encapsulation frames 10 have been formed having two second portions 16 for the traces 12. The upper pre-encapsulation frame 10 is formed having the first portions 14 of the traces 12 configured to attach to the bond pads of the semiconductor device 30, which are located solely along one side thereof, such as described in drawing FIG. 5B hereinbefore in a flip-chip style type arrangement. The lower pre-encapsulation frames 10 are formed with the first portions 14 of the traces 12 configured for attachment to the bond pads on the active surface of the semiconductor device 50, which are located along two sides thereof in a flip-chip style type arrangement as described herein.

Figure 11:
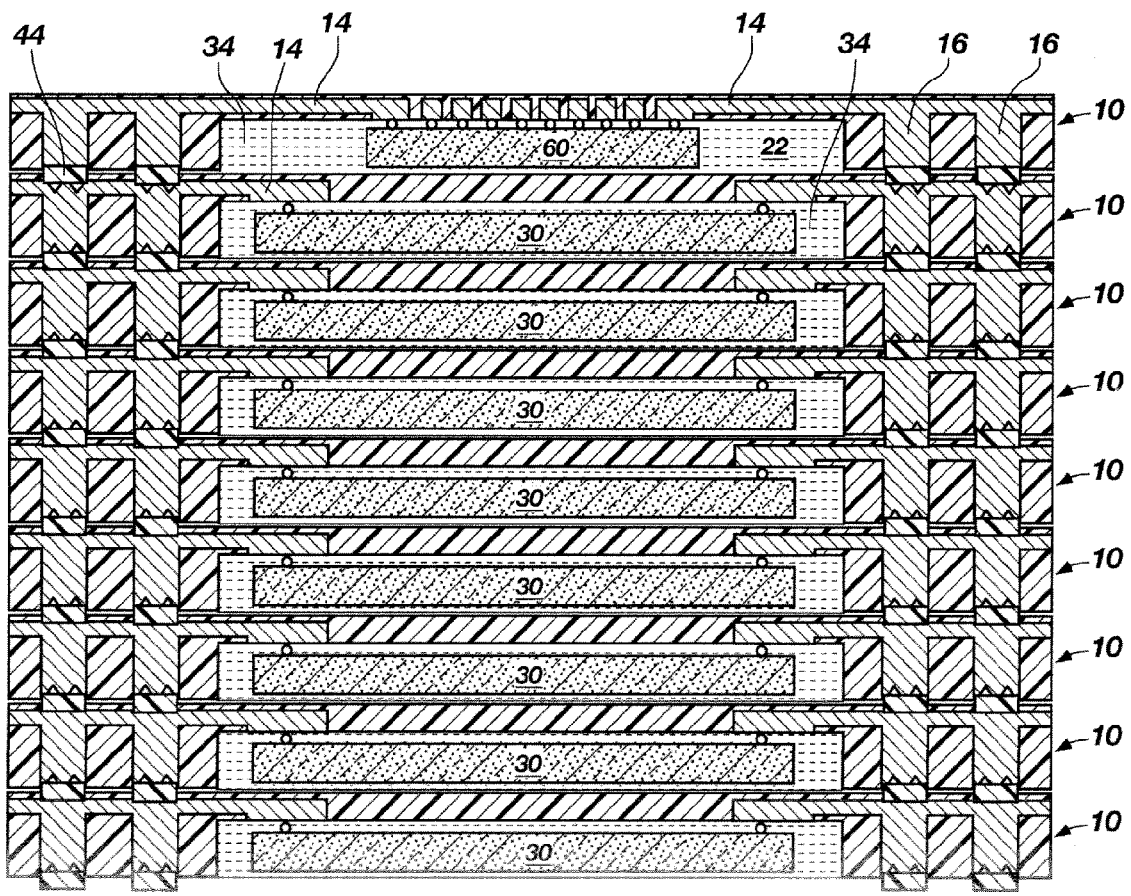
FIG. 11 is a cross-sectional view of nine stacked interconnected pre-encapsulated frames, one frame having a controller semiconductor device installed therein and eight frames having NAND semiconductor memory devices installed therein.

Referring to drawing FIG. 11, the pre-encapsulation frame 10 is illustrated in cross section in a stacked and interconnected configuration for use with semiconductor device 60, such as a controller semiconductor device known in the art, and eight other semiconductor devices 50, such as a NAND Flash memory type semiconductor device, in a stacked configuration. All pre-encapsulation frames 10 have been formed having two second portions 16 for the traces 12. The upper pre-encapsulation frame 10 is formed having the first portions 14 of the traces 12 configured to attach to the bond pads of the semiconductor device 60, which are located solely along one side thereof, such as described in drawing FIG. 5B hereinbefore in a flip-chip style type arrangement. The lower pre-encapsulation frame 10 is formed with the first portions 14 of the traces 12 configured for attachment to the bond pads on the active surface of the semiconductor device 50, which are located along two sides thereof in a flip-chip style type arrangement as described herein.

Figure 12:
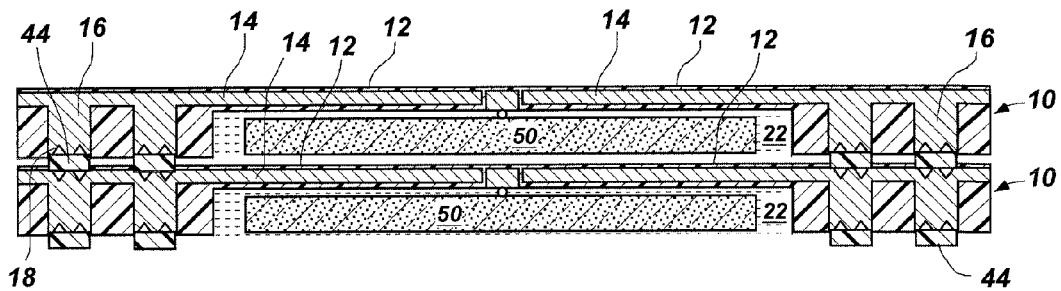
FIG. 12 is a cross-sectional view of two stacked interconnected pre-encapsulated frames, each frame having a semiconductor device having bond pads on the active surface thereof arranged essentially in the center of the active surface essentially in a row.

Referring to drawing FIG. 12, the pre-encapsulation frame 10 is illustrated in cross section in a stacked and interconnected configuration for use with semiconductor devices 50, such as DRAM Flash memory type semiconductor device having the bond pads located on the active surface thereof in essentially a single column in essentially the center of the active surface. Both pre-encapsulation frames 10 have been formed having two second portions 16 for the traces 12. The upper pre-encapsulation frame 10 is formed having the first portions 14 of the traces 12 configured to attach to the bond pads of the semiconductor device 50 hereinbefore in a flip-chip style type arrangement. Each pre-encapsulation frame 10 is connected to the other by reflowed solder paste 44 between the connection areas 18 of the second portions 16 of the traces 12.

Figure 13:
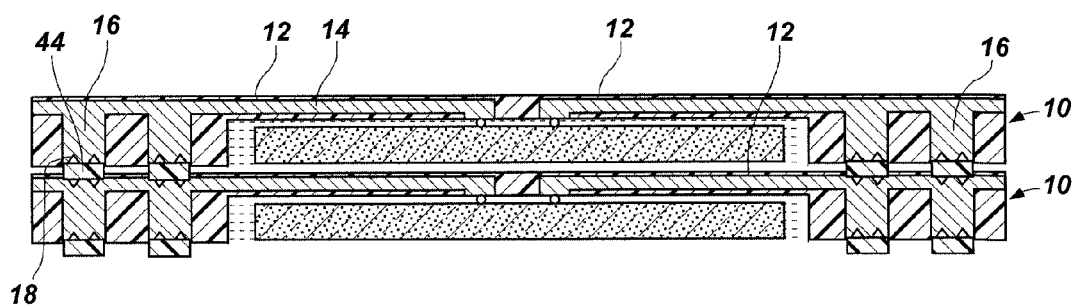
FIG. 13 is a cross-sectional view of two stacked interconnected pre-encapsulated frames, each frame having a semiconductor device having bond pads on the active surface thereof arranged essentially in the center of the active surface essentially in two rows.

Referring to drawing FIG. 13, the pre-encapsulation frame 10 is illustrated in cross section in a stacked and interconnected configuration for use with semiconductor devices 50, such as DRAM Flash memory type semiconductor device, having the bond pads located on the active surface thereof in essentially a two columns in essentially the center portion of the active surface of the semiconductor devices 50. Both pre-encapsulation frames 10 have been formed having two second portions 16 for the traces 12. The upper pre-encapsulation frame 10 is formed having the first portions 14 of the traces 12 configured to attach to the bond pads of the semiconductor device 50 hereinbefore in a flip-chip style type arrangement. Each pre-encapsulation frame 10 is connected to the other by reflowed solder paste 44 between the connection areas 18 of the second portions 16 of the traces 12.

Figure 14:
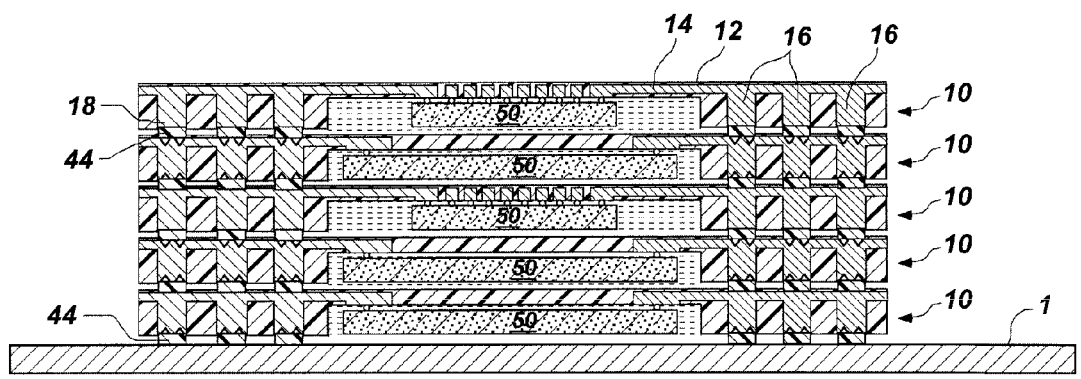
FIG. 14 is a cross-sectional view of five stacked interconnected pre-encapsulated frames located on a substrate, three frames having a NAND semiconductor devices installed therein, one frame having a DRAM semiconductor device installed therein, and one frame having a controller semiconductor device installed therein.

Referring to drawing FIG. 14, the pre-encapsulation frame 10 is illustrated in cross section in a stacked and interconnected configuration for with use for a variety of different types of semiconductor devices 50, 60 having bond pads located on their active surfaces along a number of sides thereof as described hereinbefore with all semiconductor devices 50, 60 connected to circuits on a suitable substrate 1, such as a printed circuit board. All pre-encapsulation frames 10 have been formed having three second portions 16 for the traces 12. The upper pre-encapsulation frame 10 is formed having the first portions 14 of the traces 12 configured to attach to the bond pads of the semiconductor device 50 hereinbefore in a flip-chip style type arrangement. Each pre-encapsulation frame 10 is connected to the other and to the circuits on the substrate 1 by reflowed solder paste 44 between the connection areas 18 of the second portions 16 of the traces 12 and the circuits on the substrate 1.

Figure 15:
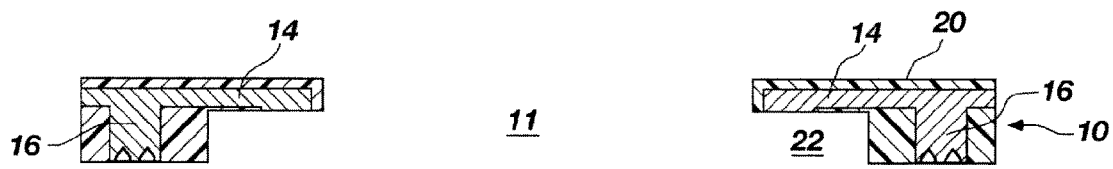
FIG. 15 is a cross-sectional view of a pre-encapsulated frame having an aperture therein.

Referring to drawing FIG. 15, a pre-encapsulation frame 10 is illustrated in cross section in a configuration for use with a CMOS imager semiconductor device (not illustrated). The pre-encapsulation frame 10 includes a central aperture 11 therein.

Figure 15A:
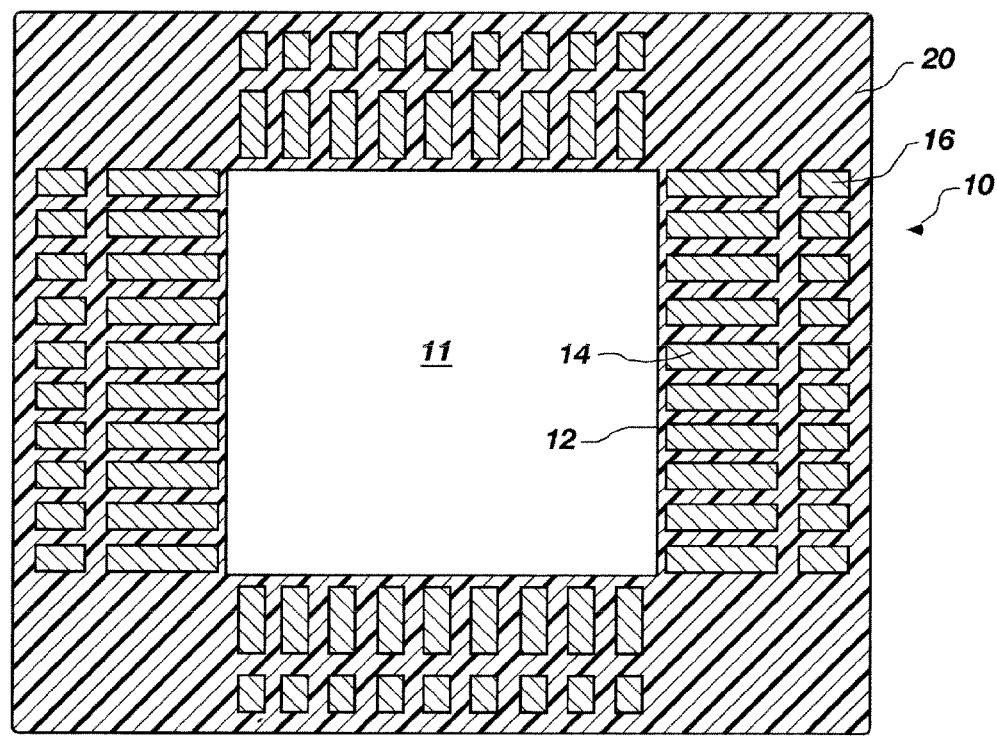
FIG. 15A is a plan view of the pre-encapsulated frame of FIG. 15 from the bottom thereof.

Referring to drawing FIG. 15A, the pre-encapsulation frame 10 illustrated in cross section in FIG. 15 is illustrated in a top view showing the four sides forming the pre-encapsulation frame 10, the central aperture 11, first portion 14 and second portion 16 of traces 12, and encapsulation material 20.

Figure 15B:
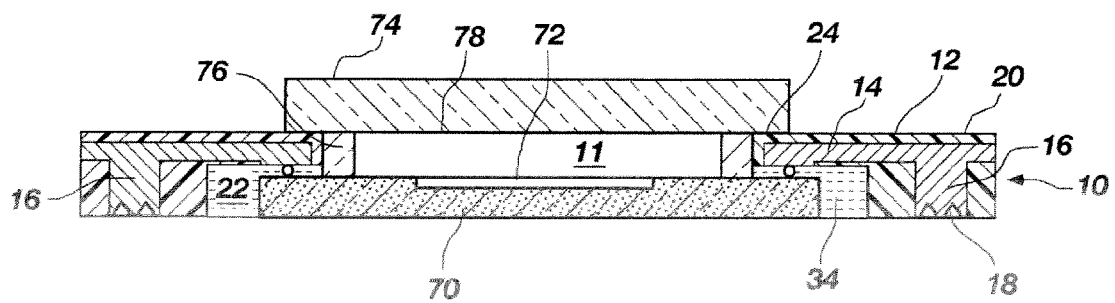
FIG. 15B is a cross-sectional view of the pre-encapsulated frame of FIG. 15 having an imaging type semiconductor device installed therein and a lens installed therewith.

Referring to drawing FIG. 15B, the pre-encapsulation frame 10 is illustrated in cross section having a CMOS imager semiconductor device 70 having an imaging area 72 connected in a flip-chip style to using gold to solder bumps to the first portion 14 of the traces 12 and having a glass 74, a transparent member, located over central aperture 11 contacting the upper surface 24 of the encapsulant 20 and attached to the CMOS imager semiconductor device 70 by members 76 extending from a lower surface 78 of the glass 74, through the aperture 11, and attached to the CMOS imager semiconductor device 70.

Figure 15C:
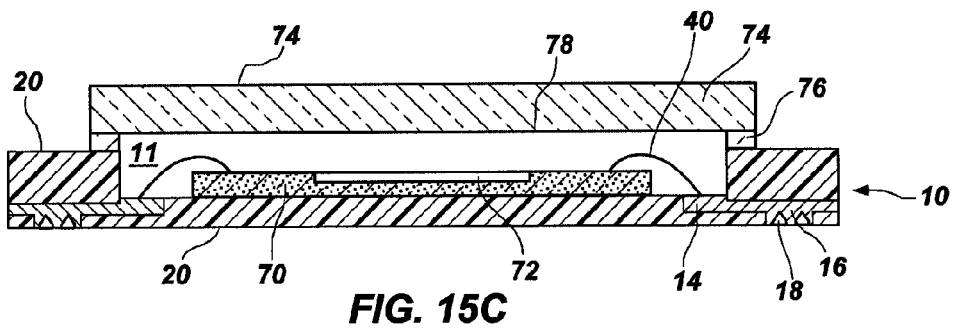
FIG. 15C is a cross-sectional view of a pre-encapsulated frame having an imaging type semiconductor device installed therein using bond wire type electrical connections and having a lens installed therewith.

Referring to drawing FIG. 15C, the pre-encapsulation frame 10 is illustrated in cross section having a CMOS imager semiconductor device 70 attached to encapsulant 20 using a suitable adhesive with the CMOS imager semiconductor device 70 connected to first portions 14 of the traces 12 using bond wires. The glass 74 is located over aperture 11 having the members 76 attaching the glass to the encapsulant 20. The second portions 16 of traces 12 are formed having connection areas 18.

Figure 15D:
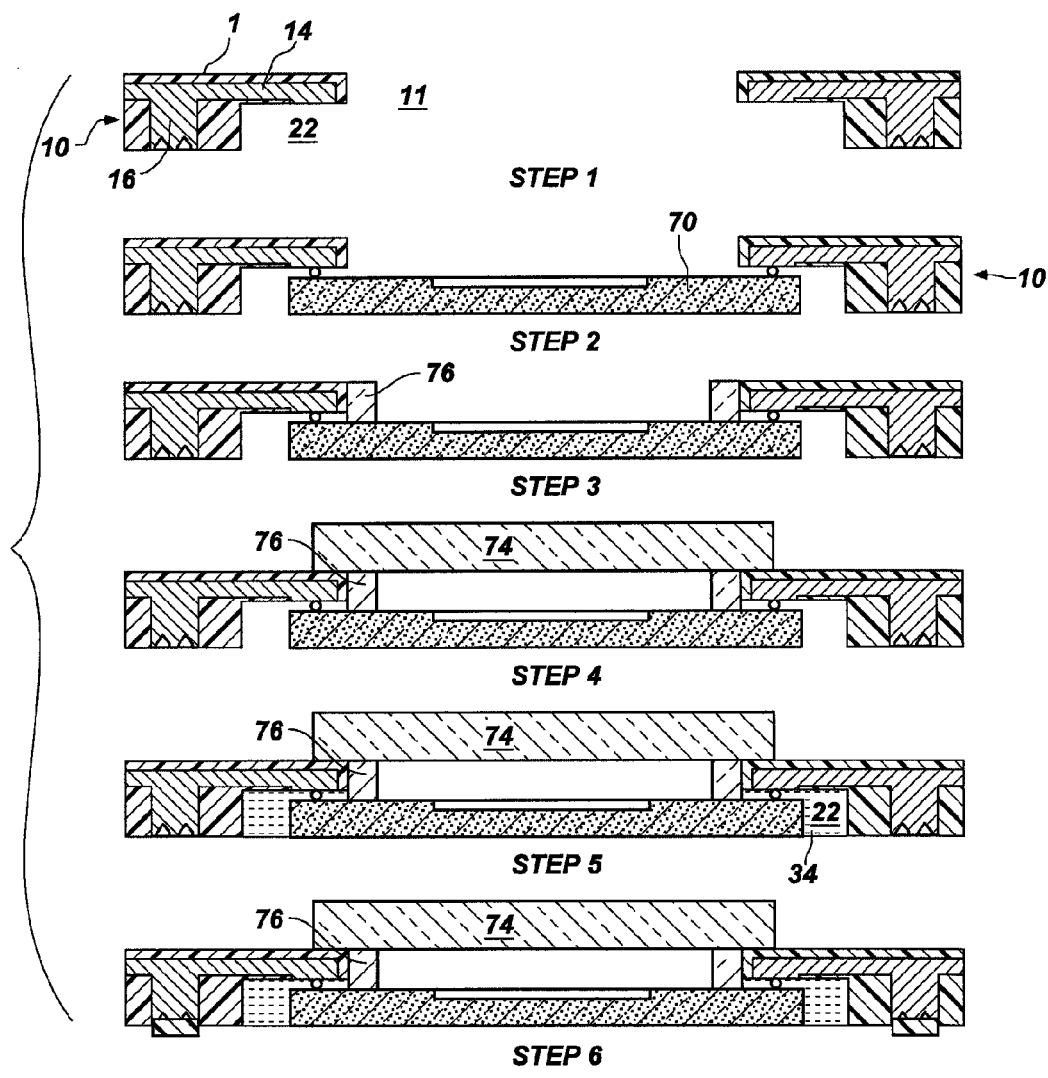
FIG. 15D is a view of the process for installing an imaging type semiconductor device in the pre-encapsulated frame.

Referring to drawing FIG. 15D, the pre-encapsulation frame 10 is illustrated in cross section, as in drawing FIG. 15 and top view in drawing FIG. 15A, for the first step in the forming of the CMOS imager semiconductor device 70 attachment thereto in a flip-chip style. In step 2, the CMOS imager semiconductor device 70 is attached to the first portions 14 of the traces 12 using gold to reflowed solder ball or bump type attachment in a flip-chip type style. In step 3, the members 76 are attached to the CMOS imager semiconductor device 70 using a suitable type adhesive. In step 4, the glass 74 is attached to the members 74 using a suitable adhesive. In step 5, a suitable encapsulant 34 is used to fill the cavity 22 to seal the CMOS imager semiconductor device 70 in the pre-encapsulation frame 10. In step 6, solder paste 44 is applied to contact areas 18 of the second portion 16 of the traces 12 for connection of the CMOS imager semiconductor device 70 to a camera chip module (not shown). This process may also be used for a CMOS imager semiconductor device 70 having connections to the first portions 14 of the traces 12 using bond wires has described herein with respect to drawing FIG. 15C.

Figure 16:
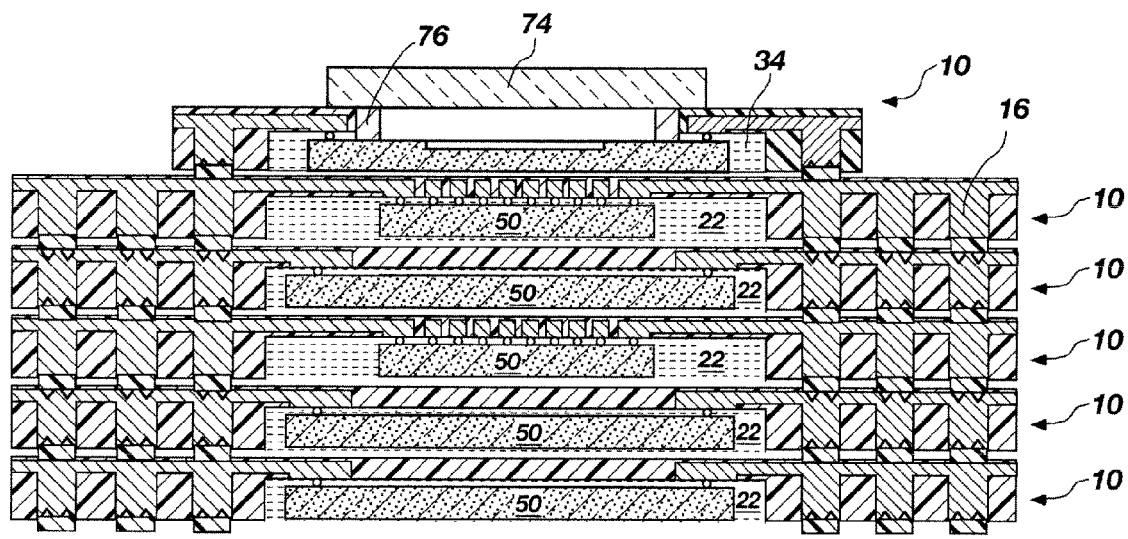
FIG. 16 is a cross-sectional view of six stacked interconnected pre-encapsulated frames, one frame having an imaging semiconductor device installed therein and a lens installed therewith, three frames having NAND semiconductor devices installed therein, one frame having a DRAM semiconductor device installed therein, and one frame having a controller semiconductor device installed therein.

Referring to drawing FIG. 16, the pre-encapsulation frame 10 is illustrated in cross section as shown in drawing FIG. 15C having a CMOS imager semiconductor device 70 attached thereto and a series of pre-encapsulation frames 10 having various semiconductor devices attached thereto in a stacked configuration as illustrated in drawing FIG. 14.

Figure 17:
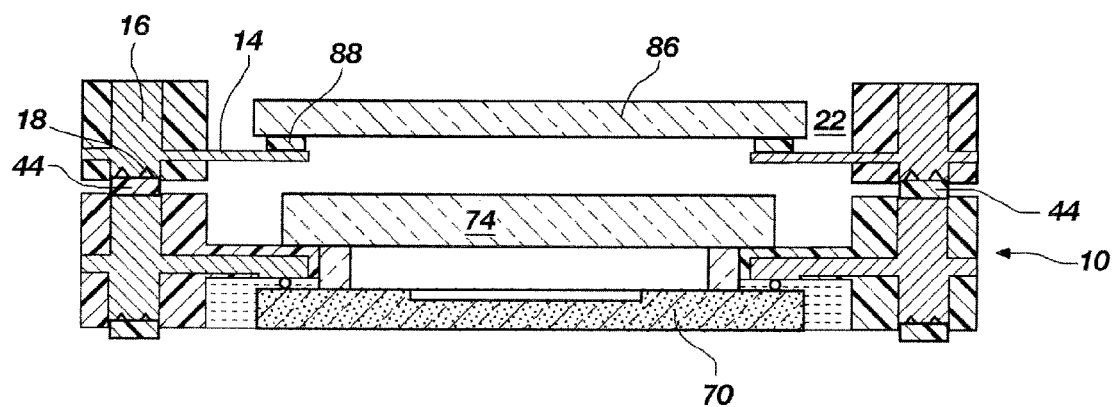
FIG. 17 is a cross-sectional view of two stacked and interconnected pre-encapsulated frames, one frame having an imaging type semiconductor device installed therein and a lens installed therewith and one frame having a lens installed therewith.

Referring to drawing FIG. 17, the pre-encapsulation frame 10 is illustrated in cross section as shown in drawing FIG. 15C having a CMOS imager semiconductor device 70 attached thereto and an additional pre-encapsulation frame 10 having a additional lens 86 attached to first portions 14 of traces 12 by a suitable adhesive 88 in cavity 22 of the pre-encapsulation frame 10. The second portions 16 of the traces 12 are connected using solder paste 44 at the connection areas 18 of the second portions 16. As many additional lenses 86 may be attached to re-encapsulation frames 10 and stacked on a preceding pre-encapsulation frame 10 having a lens 86 installed therein.

Figure 18:
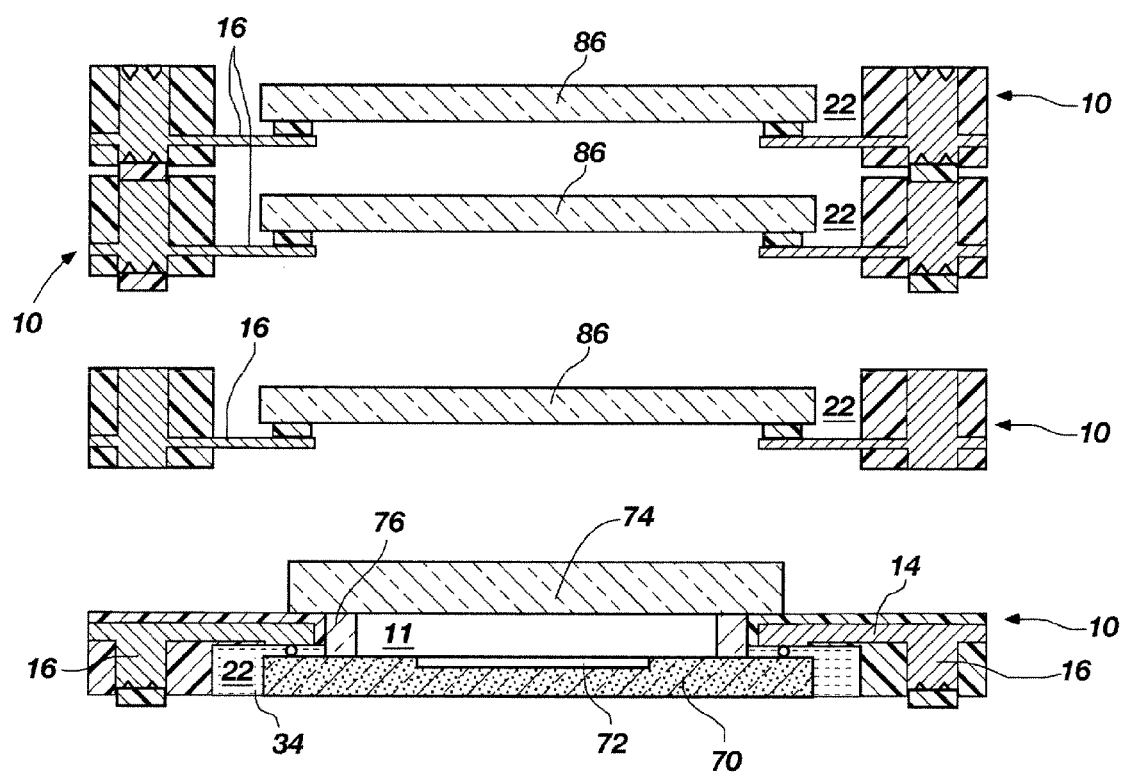
FIG. 18 is a cross-sectional view of four pre-encapsulated frames, one frame having an imaging semiconductor device installed therein and a lens therewith and three frames having lens installed therewith.

Referring to drawing FIG. 18, a pre-encapsulation frame 10 is illustrated in cross section as shown in drawing FIG. 15C having a CMOS imager 70 attached thereto and an additional pre-encapsulation frames 10 having an additional lens 86 attached to first portions 14 of traces 12 by a suitable adhesive 88 in cavity 22 of the pre-encapsulation frame 10. The second portions 16 of the traces 12 are connected using solder paste 44 at the connection areas 18 of the second portions 16. As many additional lenses 86 may be attached to pre-encapsulation frames 10 and stacked on a preceding pre-encapsulation frame 10 having a lens 86 installed therein. As illustrated, the additional two lenses 86 are used for an optical zoom effect for a camera module (not shown).

Having described the inventions of the pre-encapsulated interposer frame, it will be apparent to one of ordinary skill in the art that changes and modifications may be made thereto, such as the addition of vertical molded guides in the cavity of the pre-encapsulated interposer frame to guide a semiconductor device in position in the cavity, using a pre-capsulated interposer frame to house three or more semiconductor devices, the use of four or more second portions of the traces connected to first portions of the traces to connect to a semiconductor device, etc. Such changes or modifications are intended to be covered by the claimed inventions.

What is claimed is:

1. A semiconductor assembly including a pre-encapsulated frame, the assembly comprising:
   a structure comprising an encapsulation material and having a cavity therein, the cavity having a portion of the structure extending thereover and another portion extending therearound;
   at least two semiconductor devices located in the cavity of the structure; and
   a plurality of traces located in the encapsulation material of the structure, each trace having an upper first portion extending in the portion of the structure extending over the cavity, a lower first portion extending in a direction parallel to the direction in which the upper first portion extends in the portion of the structure extending over the cavity, and a second portion extending in the another portion of the structure connected to the first portion, one end of the second portion being exposed for connection thereto,
   wherein the upper first portion of at least one trace of the plurality of traces has a length greater than a length of the lower first portion of the at least one trace of the plurality of traces.

2. The assembly of claim 1, wherein the one end of the second portion of a trace of the plurality of traces includes at least one of one or more recesses therein and a roughened surface.

3. The assembly of claim 1, wherein the plurality of traces comprises:
a first plurality of traces having a first portion extending from one side of the structure across a portion of the cavity; and
a second plurality of traces having a first portion extending from another side of the structure across a portion of the cavity.

4. The assembly of claim 3, wherein the plurality of traces further comprise:
a third plurality of traces having a first portion extending from a third side of the structure across a portion of the cavity.

5. The assembly of claim 4, wherein the plurality of traces further comprise:
a fourth plurality of traces having a first portion extending from a fourth side of the structure across a portion of the cavity.

6. The assembly of claim 1, wherein the second portion of a trace includes two portions exposed from the structure.

7. The assembly of claim 1, wherein another end of a trace is exposed for connection thereto.

8. The assembly of claim 1, wherein the pre-encapsulated frame comprises one of a strip of pre-encapsulated frames.

9. The assembly of claim 1, wherein the pre-encapsulated frame comprises one of a panel of pre-encapsulated frames.

10. The assembly of claim 1, wherein at least one semiconductor device of the at least two semiconductor devices comprises a flip-chip type semiconductor device.

11. The assembly of claim 1, wherein at least one semiconductor device of the at least two semiconductor devices comprises a semiconductor device having at least one bond pad thereof connected to at least one trace using a bond wire.

12. The assembly of claim 1, wherein the plurality of traces comprises a plurality of traces configured for connection to at least one semiconductor device having bond pads in a one-sided layout and at least another semiconductor device.

13. The assembly of claim 1, wherein the plurality of traces comprises a plurality of traces configured for connection to at least one semiconductor device having the bond pads thereof in a 1.5 sided layout and at least another semiconductor device.

14. The assembly of claim 1, wherein the plurality of traces comprises a plurality of traces configured for connection to at least one semiconductor device having the bond pads thereof in a one sided layout along the long side of the semiconductor device and at least another semiconductor device.

15. The assembly of claim 1, wherein the plurality of traces comprises a plurality of traces configured for connection to at least one semiconductor device having the bond pads thereof in a two sided layout and at least another semiconductor device.

16. The assembly of claim 1, wherein the plurality of traces comprises a plurality of traces configured for connection to at least one semiconductor device having the bond pads thereof located essentially in the center of the semiconductor device and at least another semiconductor device.

17. The assembly of claim 1, wherein the plurality of traces comprises a plurality of traces configured for connection to at least one semiconductor device having the bond pads thereof located essentially in a single row in the center of the semiconductor device and at least another semiconductor device.

18. The assembly of claim 1, wherein the plurality of traces comprises a plurality of traces configured for connection to at least one semiconductor device having the bond pads thereof located essentially in multiple rows essentially in the center of the semiconductor device and at least another semiconductor device.

19. The assembly of claim 1, further comprising:
encapsulation material located in the cavity of the structure.

20. The assembly of claim 1, wherein the one end of the second portion of a trace of the plurality of traces includes one of a groove therein and a roughened surface thereon.

21. The assembly of claim 1, wherein the second portion of a trace of the plurality of traces comprises a plurality of portions, each portion having one end of the second portion exposed for connection thereto.

22. A semiconductor assembly including a pre-encapsulated frame, the assembly comprising:
a first structure comprising an encapsulation material and having a cavity therein, the cavity having a portion of the first structure extending thereover and another portion extending therearound;
a plurality of traces located in the first structure, each trace having a first portion having only a first length extending in the portion of the first structure extending over the cavity and a second portion extending in the another portion of the structure connected to the first portion, one end of the second portion being exposed for connection thereto,
wherein the first portion of at least one trace of the plurality of traces located in the first structure has a first length;
a first semiconductor device located in the cavity of the first structure;
a second structure comprising an encapsulation material and having a cavity therein, the cavity having a portion of the second structure extending thereover and another portion extending therearound;
a plurality of traces located in the second structure, each trace having a first portion having only a second, different length extending in a direction parallel to the direction in which the first portion of the plurality of traces of the first structure extends in the portion of the second structure extending over the cavity and a second portion extending in the another portion of the second structure connected to the first portion, one end of the second portion being exposed for connection thereto by the one end of the second portion of a trace of the plurality of traces of the first structure; and
a second semiconductor device located in the cavity of the second structure.

23. The assembly of claim 22, wherein the first semiconductor device comprises a NAND semiconductor memory device.

24. The assembly of claim 23, wherein the second semiconductor device comprises a DRAM semiconductor memory device.

25. The assembly of claim 22, wherein the first semiconductor device comprises a controller semiconductor device.

26. The assembly of claim 22, wherein the first semiconductor device comprises one of a controller semiconductor device and a NAND semiconductor memory device and the second semiconductor device comprises one of a NAND semiconductor memory device and a DRAM semiconductor memory device.

27. The assembly of claim 22, further comprising:
a substrate having circuits thereon connected to one of the first structure and the second structure.

28. A semiconductor assembly comprising a pre-encapsulated frame, the assembly comprising:
a structure comprising an encapsulation material and having a cavity therein, the cavity having a portion of the structure extending thereover and another portion extending therearound; and
a plurality of traces located in the structure, each trace having a first portion extending in the portion of the structure extending over the cavity and a second portion extending in the another portion of the structure connected to the first portion, one end of the second portion being exposed for connection thereto, the first portion of at least one trace of the plurality of traces connected to a first semiconductor device and the first portion of at least another trace of the plurality of traces connected to a second semiconductor device,
wherein the first portion of the at least one trace of the plurality of traces has a length greater than a length of the first portion of the at least another trace of the plurality of traces.

29. The assembly of claim 28, wherein the first semiconductor device comprises a semiconductor device adhesively attached to a portion of the structure and the second semiconductor device comprises a semiconductor device adhesively attached to a portion of the first semiconductor device.

30. A semiconductor assembly comprising a pre-encapsulated frame, the assembly comprising:
a structure comprising an encapsulation material and having a cavity therein, the cavity having a portion of the structure extending thereover and another portion extending therearound; and
a plurality of traces located in the structure, a first plurality of traces having a first length and a second plurality of traces having a second length, the first length being greater than the second length, each trace having a first portion extending in the portion of the structure extending over the cavity and a second portion extending in a direction parallel to the direction in which the upper first portion extends in the another portion of the structure connected to the first portion, one end of the second portion being exposed for connection thereto, the first portion of the first plurality of traces connected to a first semiconductor device and the first portion of the second plurality of traces connected to a second semiconductor device.

31. The assembly of claim 30, further comprising:
an encapsulant material located in the cavity.

32. The assembly of claim 30, wherein the first semiconductor device comprises a semiconductor device located above the second semiconductor device in the cavity.

* * * * *